United States Patent
Taki et al.

(10) Patent No.: US 7,943,957 B2
(45) Date of Patent: May 17, 2011

(54) LATERAL SOI SEMICONDUCTOR DEVICES AND MANUFACTURING METHOD THEREOF

(75) Inventors: Masato Taki, Aichi-ken (JP); Masahiro Kawakami, Toyota (JP); Kiyoharu Hayakawa, Obu (JP); Masayasu Ishiko, Nagoya (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 369 days.

(21) Appl. No.: 12/097,811

(22) PCT Filed: Nov. 17, 2006

(86) PCT No.: PCT/JP2006/323513
§ 371 (c)(1),
(2), (4) Date: Jun. 17, 2008

(87) PCT Pub. No.: WO2007/072655
PCT Pub. Date: Jun. 28, 2007

(65) Prior Publication Data
US 2009/0184370 A1  Jul. 23, 2009

(30) Foreign Application Priority Data
Dec. 21, 2005  (JP) .................................. 2005-367417

(51) Int. Cl.
*H01L 29/861* (2006.01)
(52) U.S. Cl. . 257/162; 257/122; 257/611; 257/E29.109; 257/E21.561; 257/E31.115; 257/E27.032; 438/510
(58) Field of Classification Search .................. None
See application file for complete search history.

(56) References Cited

U.S. PATENT DOCUMENTS

| 5,241,210 A | 8/1993 | Nakagawa et al. |
| 6,025,237 A * | 2/2000 | Choi .............................. 438/301 |
| 2002/0030225 A1 | 3/2002 | Nakamura et al. |
| 2004/0251499 A1 * | 12/2004 | Yamaguchi et al. .......... 257/343 |

FOREIGN PATENT DOCUMENTS

| JP | 5-259456 | 10/1993 |
| JP | 2001-15741 | 1/2001 |
| JP | 2004-200472 | 7/2004 |
| WO | WO 01/37346 A1 | 5/2001 |

OTHER PUBLICATIONS

N. Yasuhara et al., "SOI Device Structures Implementing 650 V High Voltage Output Devices on VLSIs," Proceedings of the International Electron Devices Meeting, IEEE, pp. 141-144 (Dec. 8, 1991).
Notification of Reasons for Rejection dated Oct. 19, 2010 for JP 2005-367417.

* cited by examiner

*Primary Examiner* — Minh-Loan T Tran
*Assistant Examiner* — Fei Fei Yeung Lopez
(74) *Attorney, Agent, or Firm* — Finnegan, Henderson, Farabow, Garrett & Dunner, LLP

(57) ABSTRACT

A diode 10 comprises an SOI substrate in which are stacked a semiconductor substrate 20, an insulator film 30, and a semiconductor layer 40. A bottom semiconductor region 60, an intermediate semiconductor region 53, and a surface semiconductor region 54 are formed in the semiconductor layer 40. The bottom semiconductor region 60 includes a high concentration of n-type impurity. The intermediate semiconductor region 53 includes a low concentration of n-type impurity. The surface semiconductor region 54 includes p-type impurity.

7 Claims, 8 Drawing Sheets (a)

(b)

(c)

LATERAL SOI SEMICONDUCTOR DEVICES AND MANUFACTURING METHOD THEREOF

CROSS-REFERENCE TO RELATED APPLICATIONS

This application is a national phase application of International Application No. PCT/JP2006/323513, filed Nov. 17, 2006, and claims the priority of Japanese Application No. 2005-367417, filed Dec. 21, 2005, the content of both of which is incorporated herein by reference.

The present application claims priority to Japanese Patent Application 2005-367417 filed on Dec. 21, 2005, the contents of which are hereby incorporated by reference.

TECHNICAL FIELD

This invention relates to lateral semiconductor devices. This invention also relates to a method of manufacturing the lateral semiconductor devices. The semiconductor devices of this invention may be DIODE, MISFET, MOSFET, IGBT, etc.

BACKGROUND ART

An SOI (Silicon On Insulator) substrate comprises a structure in which a semiconductor substrate, an insulator film, and a semiconductor layer are stacked. A lateral semiconductor device comprising a pair of main electrodes on a surface of the semiconductor layer of the SOI substrate is known. A lateral semiconductor device utilizing an SOI substrate will be characterized in that faulty operation caused by surge voltage does not readily occur, and is expected to be a promising semiconductor device.

FIG. 14 schematically shows a cross-sectional view of essential parts of a lateral diode 300. The diode 300 comprises a semiconductor substrate 320 including a high concentration of p-type impurity, an insulator film 330 formed on the semiconductor substrate 320, and a semiconductor layer 340 formed on the insulator film 330. The semiconductor layer 340 comprises a cathode semiconductor region 352 including a high concentration of n-type impurity, an anode semiconductor region 355 including p-type impurity, and a semiconductor active region 353 including a low concentration of n-type impurity. The semiconductor active region 353 isolates the cathode semiconductor region 352 and the anode semiconductor region 355. The cathode semiconductor region 352 is electrically connected to a cathode electrode. The anode semiconductor region 355 is electrically connected to an anode electrode. The semiconductor substrate 320 is fixed at the same potential as the anode electrode.

When a voltage higher than the anode semiconductor region 355 is applied to the cathode semiconductor region 352, the diode 300 assumes a non conducting state. At this juncture, a depleted layer 351 extends within the semiconductor active region 353 (the broken line shows an edge face of the depleted layer) from a pn boundary surface between the anode semiconductor region 355 and the semiconductor active region 353. Since the semiconductor substrate 320 is fixed at the same potential as the anode electrode, field plate effects are exerted on the depleted layer 351. As a result, the depleted layer 351 extends along the insulator film 330. As a result, a wide range of the semiconductor active region 353 is depleted, including a portion below the cathode semiconductor region 352. The semiconductor active region 353 can thus bear the potential difference between the cathode region 352 and the anode region 355. The withstand voltage of the diode 300 is restricted to the lower voltage out of: the voltage borne by the electrical field formed in a lateral direction between the cathode semiconductor region 352 and the anode semiconductor region 355, and the voltage borne by the electrical field formed in a vertical direction between the cathode semiconductor region 352 and the semiconductor substrate 320. The voltage borne in the lateral direction can be increased by lengthening the width in the lateral direction of the semiconductor active region 353. As a result, it is necessary to increase the voltage borne by the electrical field formed in the vertical direction between the cathode semiconductor region 352 and the semiconductor substrate 320 in order to increase the withstand voltage of the diode 300.

It is desirable to increase the voltage borne by the insulator film 330 so as to increase the voltage borne in the vertical direction. The thickness of the insulator film 330 may be increased in order to increase the voltage borne by this insulator film 330. However, increasing the thickness of the insulator film 330 creates the problem of increasing the time needed to form the insulator film 330. Furthermore, there is also the problem that, when the thickness of the insulator film 330 is increased, the depleted layer 351 caused by the field plate effects extends for a shorter distance. It is consequently not expedient to increase the thickness of the insulator film 330. A technique is thus desired for increasing the voltage borne in the vertical direction between the cathode semiconductor region 352 and the semiconductor substrate 320 while keeping the thickness of the insulator film 330 within a predetermined range.

For this purpose, it is desirable to increase the voltage (or the electrical field) that can be borne by the insulator film 330 per unit thickness. It is known that the voltage that can be borne by the insulator film 330 per unit thickness is usually approximately three times the critical electrical field at the boundary surface between the semiconductor active region 353 and the insulator film 330. As a result, an effective measure for increasing the voltage that can be borne by the insulator film 330 per unit thickness is to increase the critical electrical field at the boundary surface between the semiconductor active region 353 and the insulator film 330.

In T. Letavic, E. Arnold, M. Simpson, R. Aquino, H. Bhimnathwala, R. Egloff, A, Emmerik, S. Mukherjee, "High Performance 600V Smart Power Technology Based on Thin Layer Silicon-on-Insulator", ISPSD, 1997, p. 49-52 a semiconductor device is proposed in which the thickness of a semiconductor active region has been greatly reduced. The thickness of the semiconductor active region is adjusted by means of a field oxidizing layer formed on a surface of the semiconductor active region. That is, the thickness of the semiconductor active region is adjusted by adjusting the depth that the field oxidizing layer extends into the semiconductor active region. The thickness of the semiconductor active region is adjusted so as to be thin when the field oxidizing layer extends to a deep position within the semiconductor active region. When the semiconductor active region is thin, the distance is reduced that carriers must move in the vertical direction along an electrical field that is formed in the vertical direction. The avalanche breakdown occurs when the value of the ionizing rate of the carriers integrated with the distance of movement, i.e. the ionization integral, reaches 1. When the semiconductor active region is thin, there is a reduction in the distance that carriers must move, and the occurrence of the avalanche breakdown can be controlled. For this reason, in the semiconductor device of T Letavic, et al, it is possible to control the occurrence of the avalanche breakdown even though the electrical field at the boundary surface between the semiconductor active region and the insulator film has been increased. In the semiconductor device of T. Letavic, et al, therefore, the critical electrical field at the boundary surface between the semiconductor active region and the insulator film can be increased, the voltage that can be borne by the insulator film per unit thickness can be increased, and the voltage that can be borne by the insulator film can be increased.

DISCLOSURE OF THE INVENTION

However, in the semiconductor device of T. Letavic, et al, the thickness of the semiconductor active region is adjusted by means of the depth to which the field oxidizing layer extends into the semiconductor active region. Since it is difficult to adjust the thickness of the field oxidizing layer accurately, it is difficult to accurately adjust the thickness of the semiconductor active region when this method is utilized. As a result, yield rate necessarily falls when the semiconductor device is manufactured. Further, it is necessary to form a thick field oxidizing layer in order to form a thin semiconductor active region. Forming a thick field oxidizing layer increases cost.

The Smart Cut SOI is also known as a technique for reducing, with high accuracy, the thickness of the semiconductor active region. If this type of technique were used, an extremely thin semiconductor active region could probably be obtained. However, extremely thin semiconductor active regions often do not have the preferred thickness for other bipolar elements or p channel type power MOS that are simultaneously mounted in those semiconductor active regions. There is thus the problem that other performance of the semiconductor device is made worse.

The present invention aims to present a semiconductor device in which, using a structure that differs from the conventional structure, the critical electrical field at the boundary surface between the semiconductor active region and the insulator film is increased, and the voltage that is borne by the insulator film per unit thickness can be increased.

According to one aspect of the present teachings, a lateral semiconductor device comprises a bottom semiconductor region in which a high concentration of impurity has been introduced into a bottom surface part of a semiconductor layer (that is, into a part located at a bottom surface side of the semiconductor layer, a neighborhood of a boundary surface between the semiconductor layer and an insulator film). The lateral semiconductor device comprises a surface semiconductor region formed in a surface part of the semiconductor layer (that is, a part located at a surface side of the semiconductor layer) and having a conductive type that is the opposite of the conductive type of the bottom semiconductor region. Further, the lateral semiconductor device comprises an intermediate semiconductor region formed between the bottom semiconductor region and the surface semiconductor region, having the same conductive type as the conductive type of the bottom semiconductor region, and having lower impurity concentration than the impurity concentration of the bottom semiconductor region.

When the stacked structure of the surface semiconductor region, the intermediate semiconductor region, and the bottom semiconductor region is provided, the strength of an electrical field formed in the vertical direction of the semiconductor layer decreases abruptly from a boundary surface between the bottom semiconductor region and the insulator film toward the surface of the semiconductor layer. Further, the strength of the electrical field formed in the vertical direction of the semiconductor layer creates the phenomenon wherein a direction of the vertical electrical field is inverted within the semiconductor layer. The location at which the strength of the electrical field formed in the vertical direction of the semiconductor layer becomes 0 can be formed at a location deep in the semiconductor layer. The location at which the strength of the electrical field formed in the vertical direction of the semiconductor layer becomes 0 can be adjusted by adjusting the shape of the bottom semiconductor region, the intermediate semiconductor region, and the surface semiconductor region, and/or adjusting the impurity concentration, etc. As a result, although the carriers travel from the boundary surface between the bottom semiconductor region and the insulator film to the location at which the strength of the vertical electrical field becomes 0, the carriers cannot travel further in the vertical direction in the surface side of the semiconductor region. Consequently, the distance that the carriers travel in the vertical direction within the semiconductor layer can be restricted by adjusting the shape of the bottom semiconductor region, the intermediate semiconductor region, and the surface semiconductor region, and/or adjusting the impurity concentration, etc. The distance that the carriers travel in the vertical direction can be kept short in the lateral semiconductor device, and it is possible to control the occurrence of the avalanche breakdown. In the lateral semiconductor device, therefore, the occurrence of the avalanche breakdown can be controlled even though the electrical field has increased at the boundary surface between the bottom semiconductor region and the insulator film. The critical electrical field at the boundary surface between the bottom semiconductor region and the insulator film can thus be increased, the voltage that can be borne by the insulator film per unit thickness can be increased, and the voltage that can be borne by the insulator film can be increased.

According to one aspect of the present teachings, a semiconductor device can be realized in a lateral semiconductor device. The lateral semiconductor device of this aspect comprises a semiconductor substrate, an insulator film formed on the semiconductor substrate, and a semiconductor layer formed on the insulator film. The semiconductor layer comprises a first semiconductor region, a second semiconductor region, a surface semiconductor region, a bottom semiconductor region, and an intermediate semiconductor region. The first semiconductor region is formed in a portion of the semiconductor layer, includes an impurity of a first conductive type, and is electrically connected to a first main electrode. The second semiconductor region is formed in the other portion of the semiconductor layer, is away from the first semiconductor region, includes an impurity of a second conductive type, and is electrically connected to a second main electrode. The surface semiconductor region is formed in the surface portion of the semiconductor layer between the first semiconductor region and the second semiconductor region, includes an impurity of the second conductive type, and is electrically connected to the second main electrode. The bottom semiconductor region is formed in the bottom portion of the semiconductor layer between the first semiconductor region and the second semiconductor region, is away from the surface semiconductor region, and includes an impurity of the first conductive type. The intermediate semiconductor region is formed in a portion of the semiconductor layer between the surface semiconductor region and the bottom semiconductor region, makes contact with the first semiconductor region and the second semiconductor region, and includes an impurity of the first conductive type. The impurity concentration of the bottom semiconductor region is higher than the impurity concentration of the intermediate semiconductor region.

The surface semiconductor region may be electrically connected to the second main electrode by directly connecting the surface semiconductor region to the second main electrode, or by having the surface semiconductor region and the second semiconductor region make contact, thus indirectly connecting the surface semiconductor region to the second main electrode via the second semiconductor region.

With the lateral semiconductor device, the strength of an electrical field formed in the vertical direction of the semiconductor layer decreases abruptly from the boundary surface between the bottom semiconductor region and the insulator film toward the surface of the semiconductor layer. Further, the strength of the electrical field formed in the vertical direction of the semiconductor layer creates the phenomenon wherein a direction of the electric field extending in the vertical direction is inverted within the semiconductor layer. Consequently, the location at which the strength of the electrical field formed in the vertical direction of the semiconductor layer becomes 0 can be formed at a location deep in the semiconductor layer. As a result, the distance that the carriers travel in the vertical direction can be kept short in the semiconductor layer, and it is possible to control the occurrence of the avalanche breakdown. In the lateral semiconductor device, therefore, occurrence of the avalanche breakdown can be controlled even though the electrical field is high at the boundary surface between the bottom semiconductor region and the insulator film. The critical electrical field at the boundary surface between the bottom semiconductor region and the insulator film can thus be increased in the lateral semiconductor device, the voltage that can be borne by the insulator film per unit thickness can be increased, and the voltage that can be borne by the insulator film can be increased.

According to one aspect of the present teachings, it is preferred that the amount of positive space charge and the amount of negative space charge within a zone of the semiconductor layer, the zone extending vertically at a region where the surface semiconductor region, the intermediate semiconductor region and the bottom semiconductor region are stacked, are identical when the semiconductor device is in an off state.

With this lateral semiconductor device, the amount of positive space charge and the amount of negative space charge can be made identical by adjusting the shape of the bottom semiconductor region, the intermediate semiconductor region, and the surface semiconductor region, and/or adjusting the impurity concentration, etc. When the amount of positive space charge and the amount of negative space charge are identical, a wide region of the bottom semiconductor region, the intermediate semiconductor region, and the surface semiconductor region can be depleted when the semiconductor device is in an off state.

According to one aspect of the present teachings, it is preferred that the impurity concentration of the bottom semiconductor region decreases from a boundary surface between the bottom semiconductor region and the insulator film towards a boundary surface between the bottom semiconductor region and the intermediate semiconductor region. In this case, it is preferred that the location where the impurity concentration of the bottom semiconductor region is one tenth or less of the impurity concentration of the bottom semiconductor region at the boundary surface between the bottom semiconductor region and the insulator film, is a location within 0.5 μm from the boundary surface between the bottom semiconductor region and the insulator film.

When the impurity concentration of the bottom semiconductor region fulfills the above relationship, the location at which the strength of the electrical field formed in the vertical direction of the semiconductor layer becomes 0 can be a location deep in the semiconductor layer. When the impurity concentration of the bottom semiconductor region fulfills the above relationship, the location at which the strength of the electrical field formed in the vertical direction of the semiconductor layer becomes 0 can be a location within 0.5 μm from the boundary surface between the bottom semiconductor region and the insulator film. The distance that the carriers travel in the vertical direction within the semiconductor layer thus becomes shorter, and the critical electrical field at the boundary surface between the bottom semiconductor region and the insulator film can be increased to above 0.5 MV/cm. When a critical electrical field of this value is obtained, the voltage that can be borne by the insulator film per unit thickness becomes markedly greater. As a result, a semiconductor device with high withstand voltage can be obtained.

According to one aspect of the present teachings, it is preferred that the impurity concentration of the intermediate semiconductor region decreases from a boundary surface between the intermediate semiconductor region and the bottom semiconductor region towards a boundary surface between the intermediate semiconductor region and the surface semiconductor region.

When the impurity concentration of the intermediate semiconductor region fulfills the above relationship, the location at which the strength of the electrical field formed in the vertical direction of the semiconductor layer becomes 0 can be a location deep in the semiconductor layer.

According to one aspect of the present teachings, it is preferred that the first semiconductor region extends from the surface of the semiconductor layer to the insulator film and makes contact with the bottom semiconductor region.

When the first semiconductor region extends from the surface of the semiconductor layer to the insulator film, the impurity concentration can be increased near the boundary surface between the first semiconductor region and the insulator film, and an increase in width can be controlled of a depleted layer formed in this portion. As a result, it is possible to control the occurrence of the avalanche breakdown near the boundary surface between the first semiconductor region and the insulator film. Since the first main electrode is connected to the first semiconductor region, the withstand voltage of the semiconductor device is controlled by the voltage borne in the vertical direction in which the first semiconductor region and the semiconductor substrate are joined. As a result, when the first semiconductor region reaches the insulator film, the critical electrical field at the boundary surface between the first semiconductor region and the insulator film can be increased, and the voltage that can be borne by the insulator film can be increased. The voltage borne in the vertical direction in which the first semiconductor region and the semiconductor substrate are joined is thus increased, and the withstand voltage of the semiconductor device can be increased.

According to one aspect of the present teachings, it is preferred that the impurity concentration of the bottom semiconductor region decreases along a direction extending from the first semiconductor region toward the second semiconductor region.

In the lateral semiconductor device, an amount of space charge having one polarity, this resulting from a MOS structure formed from the semiconductor substrate, the insulator film, and the semiconductor layer, increases from the first semiconductor region side toward the second semiconductor region side when the semiconductor device is in an off state. When the impurity concentration of the bottom semiconductor region decreases along the direction extending from the first semiconductor region toward the second semiconductor region, the amount of space charge having the other polarity of the bottom semiconductor region can be made to increase from the first semiconductor region side toward the second semiconductor region side when the semiconductor device is in an off state. As a result, a wide region of the bottom semiconductor region, the intermediate semiconductor region, and the surface semiconductor region can be depleted when the semiconductor device is in an off state, and potential distribution between the first semiconductor region and the second semiconductor region can be made uniform. Consequently, it is possible to control the phenomenon wherein the electrical field accumulates locally, and a lateral semiconductor device with high withstand voltage can be obtained.

According to one aspect of the present teachings, the lateral semiconductor device can be realized in an n-type channel lateral semiconductor device. The lateral semiconductor device comprises a semiconductor substrate, an insulator film formed on the semiconductor substrate, and a semiconductor layer formed on the insulator film. The semiconductor layer comprises an n-type well semiconductor region, a p-type well semiconductor region, a surface semiconductor region, a bottom semiconductor region, an intermediate semiconductor region, and a source semiconductor region. The n-type well semiconductor region is formed in a portion of the semiconductor layer, includes an impurity of n-type, and is electrically connected to a drain electrode. The p-type well semiconductor region is formed in the other portion of the semiconductor layer, is away from the n-type well semiconductor region, includes an impurity of p-type, and is electrically connected to a source electrode. The surface semiconductor region is formed in the surface portion of the semiconductor layer between the n-type well semiconductor region and the p-type well semiconductor region, includes an impurity of p-type, and is electrically connected to the source electrode. The bottom semiconductor region is formed in the bottom portion of the semiconductor layer between the n-type well semiconductor region and the p-type well semiconductor region, is away from the surface semiconductor region, and includes an impurity of n-type. The intermediate semiconductor region is formed in a portion of the semiconductor layer between the surface semiconductor region and the bottom semiconductor region, makes contact with the n-type well semiconductor region and the p-type well semiconductor region, and includes an impurity of n- type. The source semiconductor region is formed in a portion of the p-type well semiconductor region, is isolated from the intermediate semiconductor region by the p-type well semiconductor region, includes an impurity of n-type, and is electrically connected to the source electrode. The impurity concentration of the bottom semiconductor region is higher than the impurity concentration of the intermediate semiconductor region.

According to one aspect of the present teachings, the lateral semiconductor device can also be realized in a p-type channel lateral semiconductor device. The lateral semiconductor device comprises a semiconductor substrate, an insulator film formed on the semiconductor substrate, and a semiconductor layer formed on the insulator film. The semiconductor layer comprises an n-type well semiconductor region, a p-type well semiconductor region, a surface semiconductor region, a bottom semiconductor region, an intermediate semiconductor region, and a source semiconductor region. The n-type well semiconductor region is formed in a portion of the semiconductor layer, includes an impurity of n-type, and is electrically connected to a source electrode. The p-type well semiconductor region is formed in the other portion of the semiconductor layer, is away from the n-type well semiconductor region, includes an impurity of p-type, and is electrically connected to a drain electrode. The surface semiconductor region is formed in the surface portion of the semiconductor layer between the n-type well semiconductor region and the p-type well semiconductor region, includes an impurity of p-type, and is electrically connected to the drain electrode. The bottom semiconductor region is formed in the bottom portion of the semiconductor layer between the n-type well semiconductor region and the p-type well semiconductor region, is away from the surface semiconductor region, and includes an impurity of n-type. The intermediate semiconductor region is formed in a portion of the semiconductor layer between the surface semiconductor region and the bottom semiconductor region, makes contact with the n-type well semiconductor region and the p-type well semiconductor region, and includes an impurity of n-type. The source semiconductor region is formed in a portion of the n-type well semiconductor region, is isolated from the intermediate semiconductor region by the n-type well semiconductor region, includes an impurity of p-type, and is electrically connected to the source electrode. The impurity concentration of the bottom semiconductor region is higher than the impurity concentration of the intermediate semiconductor region.

According to one aspect of the present teachings, a manufacturing method that can be utilized in manufacturing a lateral semiconductor device also be created. The manufacturing method is utilized in manufacturing a lateral semiconductor device comprising a semiconductor substrate, an insulator film formed on the semiconductor substrate and a semiconductor layer formed on the insulator film, the semiconductor layer having a plurality of semiconductor regions, each semiconductor region having a unique impurity concentration. The manufacturing method comprises: a first step of covering the semiconductor layer by a first mask, and introducing an impurity, a second step of covering the semiconductor layer by a second mask and introducing an impurity, and repeating the above steps "N" times. Here, the concentration of impurity introduced into the semiconductor layer at the first step is "A", the concentration of impurity introduced into the semiconductor layer at the second step is "2×A", and the concentration of impurity introduced into the semiconductor layer at the N-th step is "$2^{N-1} \times A$". Each of the masks 1 to N has a different shape from the other masks.

In order to aid in understanding the manufacturing method, an example will be described of forming a semiconductor region utilizing, for example, three masks. The following description has been adopted for the sake of convenience, and the manufacturing method of the present invention is not restricted by the following.

In the case where three masks are utilized, the amount of impurity introduced by the masks will be "1", "2", and "4". "1", "2", and "4" increase by powers of 2. i.e. "$2^0$", "$2^1$", and "$2^2$". The following is possible with this manufacturing method: the amount of impurity "1" is introduced into a first region, the amount of impurity "2" is introduced into a second region, the amount of impurity "3" that is the sum of "1" and "2" is introduced into a third region, the amount of impurity "4" is introduced into a fourth region, the amount of impurity "5" that is the sum of "1" and "4" is introduced into a fifth region, the amount of impurity "6" that is the sum of "2" and "4" is introduced into a sixth region, and the amount of impurity "7" that is the sum of "1", "2" and "4" is introduced into a seventh region. That is, when the number of part regions that are formed is added to a 0 region in which an impurity is not introduced, the number of regions is identical to "8", i.e. 2 to the power of three.

In the case where a plurality of semiconductor regions having differing impurity concentrations is to be formed, it is possible, utilizing the above manufacturing method, to form the semiconductor regions using a lesser number of masks than the number of semiconductor regions. A plurality of semiconductor regions having differing impurity concentrations can be manufactured at low cost.

With a lateral semiconductor device of the present invention, it is possible to increase the critical electrical field at the boundary surface between the bottom semiconductor region and the insulator film. As a result, the voltage that can be borne by the insulator film per unit thickness can be increased, and a lateral semiconductor device with high withstand voltage can be obtained.

BEST MODE FOR CARRYING OUT THE INVENTION

Important characteristics of the embodiments will be listed.

(First characteristic) When the thickness of a semiconductor layer is 1, it is preferred that the thickness of a surface semiconductor region is within the range 0.4 to 0.6. The location at which the strength of the electrical field formed in the vertical direction of the semiconductor layer becomes 0 is a location in the semiconductor layer near the boundary surface with the insulator film.

(Second characteristic) In the first characteristic, when the thickness of the semiconductor layer is 1, it is preferred that the thickness of a bottom semiconductor region is within the range of 0.3 or below. The location at which the strength of the electrical field in the vertical direction of the semiconductor layer becomes 0 is located in the semiconductor layer near the boundary surface between the semiconductor region and the insulator film. the strength of the electrical field becomes 0 by means of the multiplied results of the surface semiconductor region and the bottom semiconductor region.

(Third characteristic) It is more preferred that the thickness of the bottom semiconductor region is adjusted to 0.1 μm or below. When the thickness of the bottom semiconductor region is 0.1 μm or below, the critical electrical field at the boundary surface between the bottom semiconductor region and the insulator film can be 0.65 MV/cm or above.

(Fourth characteristic) It is preferred that the bottom semiconductor region is formed by ion injection. Further, it is preferred that excessive thermal diffusion is not performed after the ion injection. Impurity distribution in the bottom semiconductor region can be made to have an extremely steep state. If an appropriate thermal process is utilized (950° C. or below), the impurity that has been injected can be distributed unevenly (piled up) near the boundary surface between the bottom semiconductor region and the insulator film. In this case, this is advantageous for the impurity concentration of the bottom semiconductor region to be distributed in an extremely steep state.

(Fifth characteristic) The bottom semiconductor region comprises a plurality of part regions. Each part region has a differing impurity concentration.

Embodiments will be described below with reference to the figures. Silicon is used in the semiconductor material of all the embodiments. Furthermore, the lateral semiconductor devices of the embodiments have the same operation and results even if semiconductor materials other than silicon are utilized, such as cadmium nitride, silicon carbide, gallium arsenide, etc.

FIRST EMBODIMENT

Figure 1:
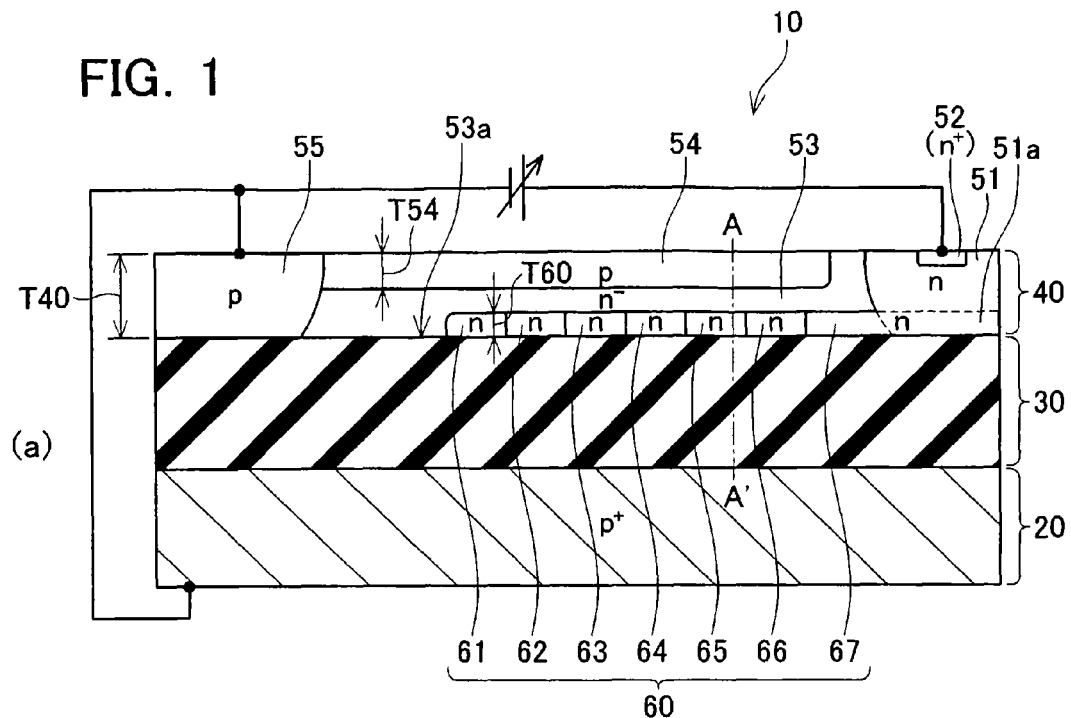
FIG. 1(a) schematically shows a cross-sectional view of essential parts of a diode of a first embodiment.
FIG. 1(b) shows an impurity concentration of a bottom semiconductor region and an intermediate region in a vertical direction.
FIG. 1(c) shows an impurity concentration of a bottom semiconductor region in a horizontal direction.
Figure 1:
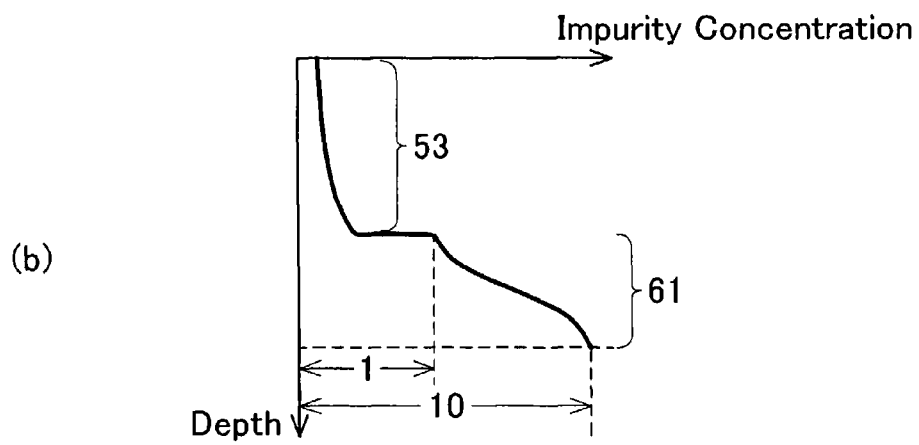
Figure 1:
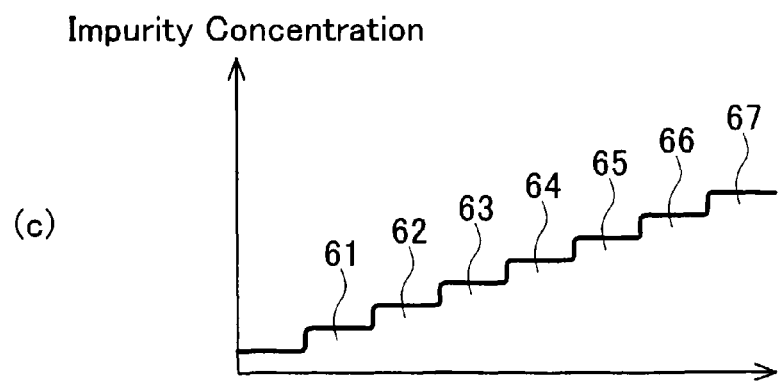

FIG. 1(a) schematically shows a cross-sectional view of essential parts of a lateral diode 10. The diode 10 comprises a monocrystal silicon semiconductor substrate 20 that includes a high concentration of p-type impurity (typically boron), a silicon oxide ($SiO_2$) insulator film 30 formed on the semiconductor substrate 20, and a monocrystal silicon semiconductor layer 40 formed on the insulator film 30. The stacked structure of the semiconductor substrate 20, insulator film 30, and semiconductor layer 40 is generally called an SOI (Silicon On Insulator) substrate. A thickness T40 of the semiconductor layer 40 is generally adjusted to 0.4 to 2 μm. The semiconductor substrate 20 may include a high concentration of n-type impurity (typically phosphorus). The semiconductor substrate 20 can essentially be considered a conductor.

The semiconductor layer 40 comprises an n-type well semiconductor region 51 (an example of a first semiconductor region), an anode semiconductor region 55 (an example of a second semiconductor region), a surface semiconductor region 54, a bottom semiconductor region 60, and an intermediate semiconductor region 53.

The n-type well semiconductor region 51 is formed in a portion of the semiconductor layer 40, and includes an impurity of n-type (typically phosphorus). The impurity concentration of the n-type well semiconductor region 51 is generally adjusted to $5 \times 10^{16}$ to $5 \times 10^{17}$ $cm^{-3}$. A cathode semiconductor region 52 that includes a high concentration of n-type impurity (typically phosphorus) is formed in a surface of the n-type well semiconductor region 51. The cathode semiconductor region 52 can be considered a portion of the n-type well semiconductor region 51. The impurity concentration of the cathode semiconductor region 52 is generally adjusted to $1 \times 10^{19}$ to $1 \times 10^{22}$ $cm^{-3}$. The n-type well semiconductor region 51 is electrically connected to a cathode electrode via the cathode semiconductor region 52. The n-type well semiconductor region 51 extends from a surface of the semiconductor layer 40 to the insulator film 30. As will be described later, a portion of the n-type well semiconductor region 51 overlaps with a portion of the bottom semiconductor region 60. In the present specification, this overlapping portion is termed an overlapping region 51a.

The anode semiconductor region 55 is formed in a portion of the semiconductor layer 40, and is in a location away from the n-type well semiconductor region 51. The anode semiconductor region 55 includes an impurity of p-type (typically boron). The impurity concentration of the anode semiconductor region 55 is generally adjusted to $5\times10^{16}$ to $5\times10^{17}$ $cm^{-3}$. The anode semiconductor region 55 is electrically connected to an anode electrode. The anode semiconductor region 55 extends from a surface of the semiconductor layer 40 to the insulator film 30. The anode semiconductor region 55 makes contact with the insulator film 30.

The surface semiconductor region 54 is formed in a portion of the surface of the semiconductor layer 40, and is located between the n-type well semiconductor region 51 and the anode semiconductor region 55. The surface semiconductor region 54 includes an impurity of p-type (typically boron). The integrated value of the impurity concentration in the direction of thickness of the surface semiconductor region 54 is generally adjusted to $1\times10^{12}$ to $5\times10^{12}$ $cm^2$. A thickness T54 of the surface semiconductor region 54 is generally adjusted to 0.1 to 1 μm. The surface semiconductor region 54 is connected to the anode semiconductor region 55. The surface semiconductor region 54 is electrically connected to the anode electrode via the anode semiconductor region 55.

The bottom semiconductor region 60 is formed in a portion of a bottom surface of the semiconductor layer 40, is in a location away from the surface semiconductor region 54, and is located between the n-type well semiconductor region 51 and the anode semiconductor region 55. The bottom semiconductor region 60 makes contact with the n-type well semiconductor region 51. The bottom semiconductor region 60 is away from the anode semiconductor region 55. The bottom semiconductor region 60 includes an impurity of n-type (typically phosphorus). The impurity concentration of the bottom semiconductor region 60 decreases from the boundary surface between the bottom semiconductor region 60 and the insulator film 30 towards a surface side of the semiconductor layer 40. The impurity concentration of the bottom semiconductor region 60 defines the thickness T60 of the bottom semiconductor region 60. As shown in FIG. 1(b), the thickness T60 of the bottom semiconductor region 60 is a distance from the boundary surface between the bottom semiconductor region 60 and the insulator film 30 to the location where the impurity concentration of the bottom semiconductor region 60 is one tenth or less of the impurity concentration at the boundary surface between the bottom semiconductor region 60 and the insulator film 30. The thickness T60 of the bottom semiconductor region 60 is generally adjusted to 0.5 μm or less. The bottom semiconductor region 60 comprises seven part regions 61 to 67. As shown in FIG. 1(c), the part regions 61 to 67 each have a unique impurity concentration. The impurity concentration of the part regions 61 to 67 decreases from the n-type well semiconductor region 51 side toward the anode semiconductor region 55 side. Each of the part regions 61 to 67 has a greater impurity concentration than the impurity concentration of the intermediate semiconductor region 53. The impurity concentration of the part regions 61 to 67 increases by an integral multiple from the anode semiconductor region 55 side toward the n-type well semiconductor region 51. The integrated value of the impurity concentration in the direction of thickness of the part region 67, this having the greatest impurity concentration, is generally adjusted to $1\times10^{12}$ to $5\times10^{12}$ $cm^{-2}$. Further, as described above, a portion of the n-type well semiconductor region 51 overlaps with a portion of the bottom semiconductor region 60, forming the overlapping region 51a. As a result, the impurity concentration in the overlapping region 51a is extremely high.

The intermediate semiconductor region 53 is formed in the semiconductor layer 40 between the surface semiconductor region 54 and the bottom semiconductor region 60, and makes contact with the n-type well semiconductor region 51 and the anode semiconductor region 55. The intermediate semiconductor region 53 includes a low concentration of n-type impurity (typically phosphorus). The impurity concentration of a part of the intermediate semiconductor region 53 located between the surface semiconductor region 54 and the bottom semiconductor region 60 is less than the impurity concentration of the bottom semiconductor region 60. Further, as shown in FIG. 1(b), the impurity concentration of the intermediate semiconductor region 53 decreases from the bottom surface side toward the top surface side. As will be described later, the intermediate semiconductor region 53 is formed by introducing an impurity into the semiconductor layer 40. The impurity is introduced toward a neighborhood 53a of the boundary surface between the semiconductor layer 40 and the insulator film 30. Consequently, the peak impurity concentration of the intermediate semiconductor region 53 is located at the neighborhood 53a of the boundary surface with the insulator film 30. A part of the intermediate semiconductor region 53 is later formed into the bottom semiconductor region 60 by further introducing an impurity. Before the bottom semiconductor region 60 is formed, the integrated value of the impurity concentration in the direction of thickness of the intermediate semiconductor region 53 is generally adjusted to $1\times10^{12}$ to $5\times10^{12}$ $cm^{-2}$. As a result, when the diode 10 is in a non conducting state, the amount of space charge of the intermediate semiconductor region 53 and the amount of space charge of the surface semiconductor region 54 are identical.

As described above, the peak impurity concentration of the intermediate semiconductor region 53 is located at the neighborhood 53a of the boundary surface between the intermediate semiconductor region 53 and the insulator film 30. The impurity concentration of the intermediate semiconductor region 53 at the neighborhood 53a of the boundary surface can also be adjusted to be greater than the impurity concentration at the surface side of the bottom semiconductor region 60. The impurity concentration of the part of the intermediate semiconductor region 53 located between the surface semiconductor region 54 and the bottom semiconductor region 60 is adjusted to be less than the impurity concentration of the bottom semiconductor region 60. The impurity concentration of a part of the intermediate semiconductor region 53 may also be adjusted to be greater than the impurity concentration of the bottom semiconductor region 60.

The diode 10 comprises the bottom semiconductor region 60 at a bottom part of the semiconductor layer 40, and the bottom semiconductor region 60 was formed by introducing a high concentration of n-type impurity. The diode 10 comprises the surface semiconductor region 54 at a surface part of the semiconductor layer 40, and the surface semiconductor region 54 was formed by introducing a p-type impurity. Further, the diode 10 comprises the intermediate semiconductor region 53 located between the bottom semiconductor region 60 and the surface semiconductor region 54, and the intermediate semiconductor region 53 was formed by introducing a low concentration of n-type impurity. Because the diode 10 comprises the stacked structure of the surface semiconductor region 54, the intermediate semiconductor region 53, and the bottom semiconductor region 60, the diode 10 shows a distribution of electrical field strength in the vertical direction of the semiconductor layer 40 that differs from that with the conventional structure.

Figure 2:
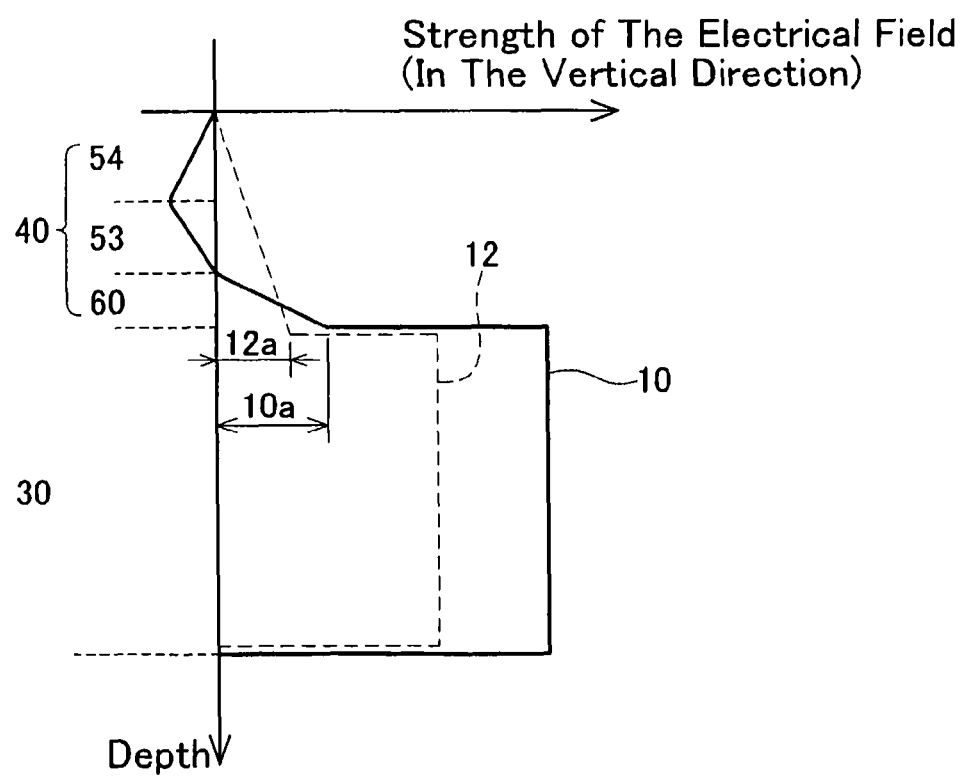
FIG. 2 shows the distribution of electrical field strength extending in the vertical direction corresponding to the line A-A' of FIG. 1.
Figure 3:
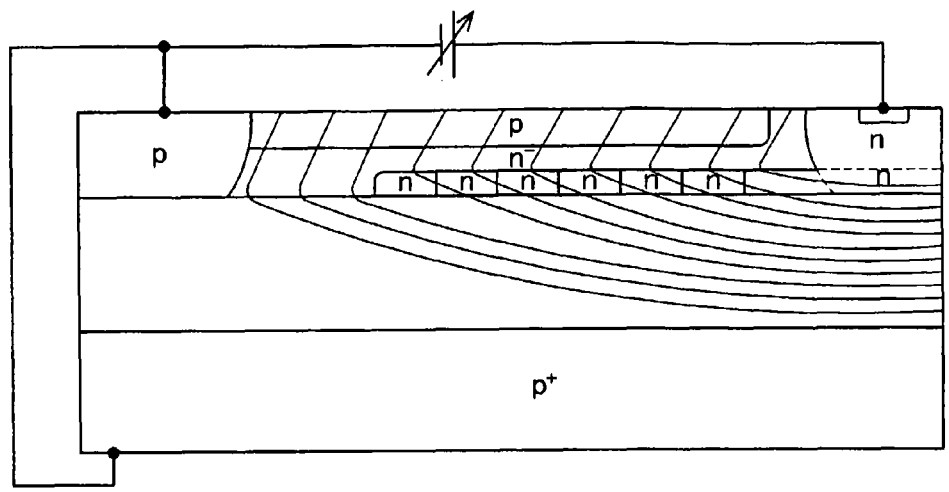
FIG. 3 shows the distribution of equipotential lines of the diode of the first embodiment.

FIG. 2 shows the distribution of electrical field strength extending in the vertical direction along the line A-A' of FIG. 1(a). FIG. 2 shows the distribution of strength of an electrical field formed in the vertical direction of the semiconductor layer 40 and the insulator film 30 when the diode 10 is in a non conducting state. The solid line of FIG. 2 shows the distribution of electrical field strength of the diode 10, and the broken line of FIG. 2 shows the distribution of electrical field strength of a prior art diode for comparison. Here, the diode for comparison is a diode that does not comprise the surface semiconductor region 54 and the bottom semiconductor region 60. Further, FIG. 3 shows the distribution of equipotential lines of the diode 10. Numbers, hatching, etc. have been omitted in FIG. 3 for the sake of clarity.

As shown in FIG. 2, the strength of an electrical field formed in the vertical direction of the diode 10 decreases abruptly from the boundary surface between the bottom semiconductor region 60 and the insulator film 30 toward the interior of the semiconductor layer 40. The strength of the electrical field formed in the vertical direction of the semiconductor layer 40 creates the phenomenon wherein a direction of the electrical field is inverted within the semiconductor layer 40. As shown FIG. 2, magnitude of the electrical field is inverted between positive and negative within the semiconductor layer 40. This phenomenon can be obtained due to the presence of the surface semiconductor region 54. Since the surface semiconductor region 54 is present, the equipotential lines are formed in bent lines within the semiconductor layer 40, as shown in FIG. 3. Furthermore, the combination of the bottom semiconductor region 60, intermediate semiconductor region 53, and surface semiconductor region 54 causes the vertices of the potential lines to be formed at a deep location within the semiconductor layer 40. Consequently, the strength of the electrical field formed in the vertical direction of the semiconductor layer 40 decreases abruptly from the boundary surface between the bottom semiconductor region 60 and the insulator film 30 toward the interior of the semiconductor layer 40. With the diode 10, the impurity concentration, and the shape of the bottom semiconductor region 60, the intermediate semiconductor region 53, and the surface semiconductor region 54 are adjusted so that the location at which the strength of the electrical field formed in the vertical direction of the semiconductor layer 40 becomes 0 is the boundary surface of the bottom semiconductor region 60 and the intermediate semiconductor region 53. In the electrical field formed in the vertical direction of the semiconductor layer 40, therefore, positive and negative strength is inverted between the bottom semiconductor region 60 and the intermediate semiconductor region 53. The bottom semiconductor region 60 has positive electrical field strength, and the intermediate semiconductor region 53 and the surface semiconductor region 54 have negative electrical field strength. As a result, although the electrons travel in a vertical direction within the bottom semiconductor region 60, the electrons cannot travel in a vertical direction within the intermediate semiconductor region 53 and the surface semiconductor region 54. Consequently, the distance that the electrons travel in the vertical direction within the semiconductor layer 40 can be restricted to the thickness T60 of the bottom semiconductor region 60. The avalanche breakdown occurs when the value of the ionization rate of the electrons integrated with respect to distance traveled, i.e. the ionization integral, reaches 1. With the diode 10, the distance traveled by the electrons is restricted to the thickness T60 of the bottom semiconductor region 60. As a result, occurrence of the avalanche breakdown can be controlled by adjusting the thickness T60 of the bottom semiconductor region 60. With the diode 10, therefore, occurrence of the avalanche breakdown can be controlled even if a critical electrical field 10a at the boundary surface between the bottom semiconductor region 60 and the insulator film 30 is increased.

By contrast, with the prior art diode for comparison, the strength of an electrical field formed in the vertical direction is positive along the interior of the semiconductor layer. As a result, the distance traveled by the electrons is the thickness of the semiconductor layer. Consequently the breakdown frequently occurs when the electrical field of the semiconductor layer increases. In the comparison diode, a critical electrical field 12a at a boundary surface between the semiconductor layer and an insulator film cannot be increased. As shown in FIG. 2, the critical electrical field 10a at the boundary surface between the bottom semiconductor region 60 and the insulator film 30 of the diode 10 can be made greater than the critical electrical field 12a at the boundary surface between the semiconductor layer and the insulator film of the comparison diode.

Since the occurrence of the avalanche breakdown is controlled in the diode 10, the critical electrical field 10a at the boundary surface between the bottom semiconductor region 60 and the insulator film 30 can be increased. The voltage that can be borne by the insulator film 30 per unit thickness becomes approximately three times the critical electrical field 10a at the boundary surface between the bottom semiconductor region 60 and the insulator film 30. In the diode 10, therefore, the voltage that can be borne by the insulator film 30 per unit thickness can be increased by increasing the critical electrical field. The voltage that can be borne by the insulator film 30 can thus be increased.

Other characteristics of the diode 10 are listed below.

(1) The location at which the strength of the electrical field formed in the vertical direction of the semiconductor layer 40 becomes 0 has a strong relationship with the thickness T60 of the bottom semiconductor region 60. As a result, it is preferred that the thickness T60 of the bottom semiconductor region 60 is within a range of 0.5 μm. When the thickness T60 of the bottom semiconductor region 60 is adjusted to be within 0.5 μm, the distance is reduced that the electrons travel in the vertical direction within the bottom semiconductor region 60, and the critical electrical field 10a at the boundary surface between the bottom semiconductor region 60 and the insulator film 30 can be increased to 0.5 MV/cm or above. Generally the critical electrical field with the conventional structure is in the range of 0.25 MV/cm to 0.4 MV/cm. If a critical electrical field 0.5 MV/cm or more can be obtained, the voltage that can be borne by the insulator film 30 per unit thickness can be made markedly greater than with the conventional structure. Further, it is more preferred that the thickness T60 of the bottom semiconductor region 60 is adjusted to be within 0.1 μm. When the thickness T60 of the bottom semiconductor region 60 is within 0.1 μm, the critical electrical field 10a at the boundary surface can be increased to 0.65 MV/cm or above.

(2) The diode 10 comprises the overlapping region 51a in which a portion of the n-type well semiconductor region 51 overlaps with a portion of the bottom semiconductor region 60. The impurity concentration of the overlapping region 51a is high. The overlapping region 51a is disposed below the cathode semiconductor region 52. The overlapping region 51a can control an increase in the width of a depleted layer below the cathode semiconductor region 52. The distance that the electrons travel across the depleted layer can be reduced by reducing the width of the depleted layer. As a result, the occurrence of the avalanche breakdown can be controlled. Consequently, the critical electrical field below the cathode semiconductor region 52 can be increased, and the voltage that can be borne by the insulator film 30 per unit thickness can be increased.

(3) The impurity concentration of the bottom semiconductor region 60 decreases from the n-type well semiconductor region 51 side towards the anode semiconductor region 55 side. The bottom semiconductor region 60 that has this type of concentration distribution is suitable for obtaining the RESURF effect between the n-type well semiconductor region 51 and the anode semiconductor region 55. That is, the bottom semiconductor region 60 that has this type of concentration distribution is formed to work against a capacitor for a MOS structure formed from the semiconductor substrate 20, the insulator film 30, and the semiconductor layer 40. The bottom semiconductor region 60 is formed to cancel the amount of negative space charge accumulated in the capacitor of the MOS structure in a non conducting state. As a result, when the diode 10 is in a non conducting state, the sum of the amount of positive space charge when the intermediate semiconductor region 53 has been depleted and the amount of positive space charge when the bottom semiconductor region 60 has been depleted is identical with the sum of the amount of negative space charge when the surface semiconductor region 54 has been depleted and the amount of negative space charge accumulated in the capacitor of the MOS structure. In the diode 10, the amounts are mutually offset of positive space charge and negative space charge included in a vertically extending range of the semiconductor layer 40, this semiconductor layer 40 comprising the stacked bottom semiconductor region 60, intermediate semiconductor region 53, and surface semiconductor region 54. This can be represented by the following formula:

$$Q_{NSOI} + Q_{BWNBL}(x) = Q_{PTOP} + (eox/T_{box}) \cdot V(x)$$

Here, $Q_{NSOI}$ is the amount of positive space charge when the intermediate semiconductor region 53 has been depleted. Further, the amount of positive space charge of the intermediate semiconductor region 53 is determined on the basis of the impurity contained in the semiconductor layer 40 before being formed into the diode and on the impurity introduced when forming the intermediate semiconductor region 53. $Q_{BWNBL}(x)$ is the amount of positive space charge when the bottom semiconductor region 60 has been depleted. With $Q_{BWNBL}(x)$, the amount of positive space charge varies in accordance with a distance x in the lateral direction. With $Q_{BWNBL}(x)$, a greater amount of positive space charge is present at the side near the n-type well semiconductor region 51. $Q_{PTOP}$ is the amount of negative space charge when the surface semiconductor region 54 has been depleted. (eox/Tbox)·V(x) is the amount of negative space charge accumulated by the capacitor of the MOS structure. With (eox/Tbox)·V(x), the amount of negative space charge varies in accordance with the voltage V(x) applied to the cathode semiconductor region 52, and with the distance x in the lateral direction. With (eox/Tbox)·V(x), a greater amount of positive space charge is present at the side near the n-type well semiconductor region 51. When the diode 10 is in a non conducting state, a high voltage is applied to the cathode electrode, and consequently the bottom semiconductor region 60 work against a capacitor for the MOS structure, and the impurity concentration of the bottom semiconductor region 60 decreases from the n-type well semiconductor region 51 side to the anode semiconductor region 55 side. Consequently a more effective RESURF effect can be obtained. As a result, the potential distribution between the n-type well semiconductor region 51 and the anode semiconductor region 55 can be made to have a uniform state when the diode 10 is a non conducting state. The phenomenon can consequently be controlled in which the electrical field is concentrated locally, and the withstand voltage of the diode 10 can be increased. Further, the technical concept of the above formula is also suitable for the second and third embodiments described below.

(4) The bottom semiconductor region 60 is formed by utilizing an ion injection technique. Further, excessive thermal diffusion (this refers to a thermal process of 950° C. or above) is not performed on the bottom semiconductor region 60 after the ions have been injected. As a result, the impurity distribution in the vertical direction in the bottom semiconductor region 60 has an extremely steep state. Because thermal diffusion is not performed, the thickness T60 in the vertical direction of the bottom semiconductor region 60 can be made extremely thin. Since the thickness T60 of the bottom semiconductor region 60 is extremely thin, the distance that the electrons travel in the vertical direction can be reduced, and occurrence of the avalanche breakdown can be controlled.

Second Embodiment

Figure 4:
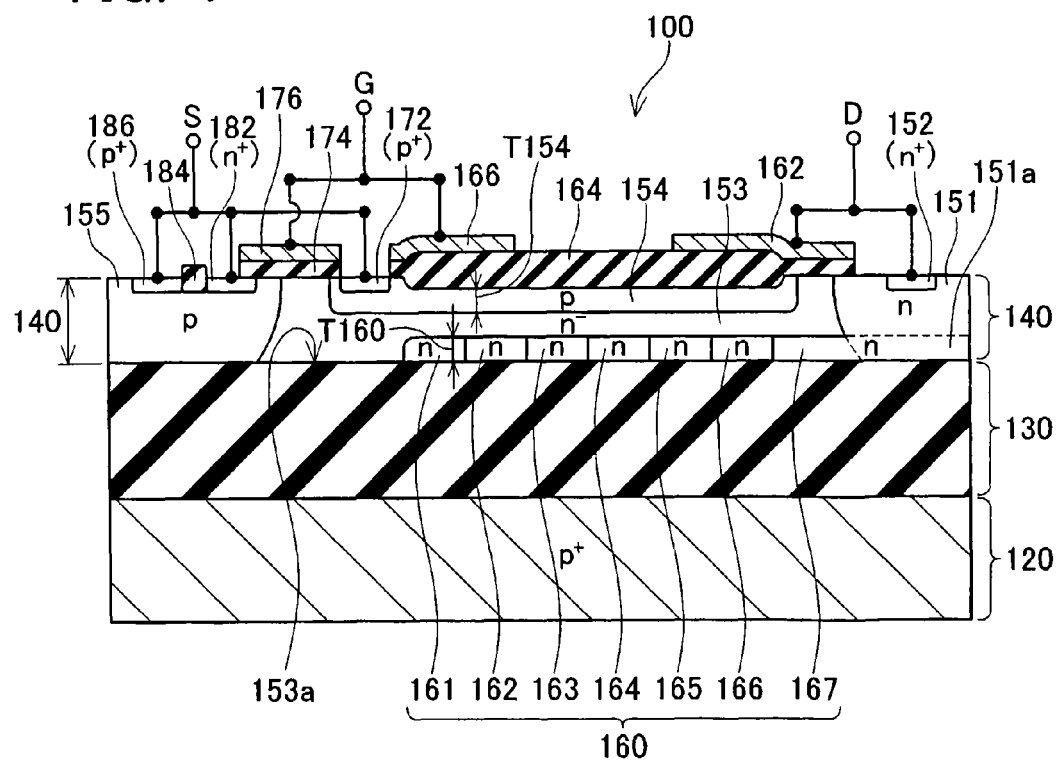
FIG. 4 schematically shows a cross-sectional view of essential parts of an LDMOS of a second embodiment.

FIG. 4 schematically shows a cross-sectional view of essential parts of a lateral n-type channel LDMOS (Laterally Diffused MOS) 100. The LDMOS 100 comprises a monocrystal silicon semiconductor substrate 120 that includes a high concentration of p-type impurity, a silicon oxide ($SiO_2$) insulator film 130 formed on the semiconductor substrate 120, and a monocrystal silicon semiconductor layer 140 formed on the insulator film 130. A thickness T140 of the semiconductor layer 140 is generally adjusted to 0.4 to 2 μm. The semiconductor substrate 120 may include a high concentration of n-type impurity (typically phosphorus). The semiconductor substrate 120 can essentially be considered a conductor.

The semiconductor layer 140 comprises an n-type well semiconductor region 151, a p-type well semiconductor region 155, a surface semiconductor region 154, a bottom semiconductor region 160, an intermediate semiconductor region 153, and a source semiconductor region 182.

The n-type well semiconductor region 151 is formed in a portion of the semiconductor layer 140, and includes an impurity of n-type (typically phosphorus). The impurity concentration of the n-type well semiconductor region 151 is generally adjusted to $5 \times 10^{16}$ to $5 \times 10^{17}$ $cm^{-3}$. A drain semiconductor region 152 that includes a high concentration of n-type impurity (typically phosphorus) is formed in a surface part of the n-type well semiconductor region 151. The drain semiconductor region 152 can be considered a part of the n-type well semiconductor region 151. The impurity concentration of the drain semiconductor region 152 is generally adjusted to $1 \times 10^{19}$ to $1 \times 10^{22}$ $cm^{-3}$. The n-type well semiconductor region 151 is electrically connected to a drain electrode D via the drain semiconductor region 152. The n-type well semiconductor region 151 extends from a surface of the semiconductor layer 140 to the insulator film 130. The LDMOS 100 comprises an overlapping region 151a in which a portion of the n-type well semiconductor region 151 overlaps with a portion of the bottom semiconductor region 160.

The p-type well semiconductor region 155 is formed in a portion of the semiconductor layer 140, and is in a location away from the n-type well semiconductor region 151. The p-type well semiconductor region 155 includes an impurity of p-type (typically boron). The impurity concentration of the p-type well semiconductor region 155 is generally adjusted to $5 \times 10^{16}$ to $5 \times 10^{17}$ $cm^{-3}$. A well-contacting semiconductor region 186 that includes a high concentration of p-type impurity (typically boron) is provided in a surface part of the p-type well semiconductor region 155. The impurity concentration of the well-contacting semiconductor region 186 is generally adjusted to $1 \times 10^{19}$ to $1 \times 10^{22}$ $cm^{-3}$. The well-contacting semiconductor region 186 can be considered a part of the p-type well semiconductor region 155. The p-type well semiconductor region 155 is electrically connected to a source electrode S via the well-contacting semiconductor region 186. The p-type well semiconductor region 155 extends from a surface of the semiconductor layer 140 to a bottom face thereof. The p-type well semiconductor region 155 makes contact with the insulator film 130.

The surface semiconductor region 154 is formed in a portion of the surface of the semiconductor layer 140, and is located between the n-type well semiconductor region 151 and the p-type well semiconductor region 155. The surface semiconductor region 154 includes an impurity of p-type (typically boron). The integrated value of the impurity concentration in the direction of thickness of the surface semiconductor region 154 is generally adjusted to $1 \times 10^{12}$ to $5 \times 10^{12}$ $cm^{-2}$. A thickness T154 of the surface semiconductor region 154 is generally adjusted to 0.1 to 1 µm. The surface semiconductor region 154 comprises a contact semiconductor region 172. The impurity concentration of the contact semiconductor region 172 is generally adjusted to $1 \times 10^{19}$ to $1 \times 10^{22}$ $cm^{-3}$. The surface semiconductor region 154 is electrically connected to the source electrode S via the contact semiconductor region 172.

The bottom semiconductor region 160 is formed in a portion of a bottom surface of the semiconductor layer 140, is in a location away from the surface semiconductor region 154, and is located between the n-type well semiconductor region 151 and the p-type well semiconductor region 155. The bottom semiconductor region 160 makes contact with the n-type well semiconductor region 151, and is away from the p-type well semiconductor region 155. The bottom semiconductor region 160 includes an impurity of n-type (typically phosphorus). The impurity concentration of the bottom semiconductor region 160 decreases from the boundary surface between the bottom semiconductor region 160 and the insulator film 130 towards a surface side of the bottom semiconductor region 160. The impurity concentration of the bottom semiconductor region 160 defines the thickness T160 of the bottom semiconductor region 160. The thickness T160 of the bottom semiconductor region 160 is a distance from the boundary surface between the bottom semiconductor region 160 and the insulator film 130 to the location where the impurity concentration of the bottom semiconductor region 160 is one tenth or less of the impurity concentration at the boundary surface between the bottom semiconductor region 160 and the insulator film 130. The thickness T160 of the bottom semiconductor region 160 is generally adjusted 0.5 µm or less. The bottom semiconductor region 160 comprises seven part regions 161 to 167. The part regions 161 to 167 each have a unique impurity concentration. The impurity concentration of the part regions 161 to 167 decreases from the n-type well semiconductor region 151 side toward the p-type well semiconductor region 155 side. Each of the part regions 161 to 167 has a greater impurity concentration than the impurity concentration of the intermediate semiconductor region 153. The impurity concentration of the part regions 161 to 167 increases by an integral multiple from the p-type well semiconductor region 155 side toward the n-type well semiconductor region 151. The integrated value of the impurity concentration in the direction of thickness of the part region 167, this having the greatest impurity concentration, is generally adjusted to $1 \times 10^{12}$ to $5 \times 10^{12}$ $cm^{-2}$. Further, as described above, a portion of the n-type well semiconductor region 151 overlaps with a portion of the bottom semiconductor region 160, thus forming the overlapping region 151a. As a result, the impurity concentration in the overlapping region 151a is extremely high.

The intermediate semiconductor region 153 is formed in the semiconductor layer 140 between the surface semiconductor region 154 and the bottom semiconductor region 160, and makes contact with the n-type well semiconductor region 151 and the p-type well semiconductor region 155. The intermediate semiconductor region 153 includes a low concentration of n-type impurity (typically phosphorus). The impurity concentration of a part of the intermediate semiconductor region 153 located between the surface semiconductor region 154 and the bottom semiconductor region 160 is less than the impurity concentration of the bottom semiconductor region 160. Further, the impurity concentration of the intermediate semiconductor region 153 decreases from the bottom surface side toward the top surface side. As will be described later, the intermediate semiconductor region 153 is formed by introducing an impurity into the semiconductor layer 140. The impurity is introduced toward a neighborhood 153a of the boundary surface between the semiconductor layer 140 and the insulator film 130. Consequently, the peak impurity concentration of the intermediate semiconductor region 153 is located at the neighborhood 153a of the boundary surface with the insulator film 130. A part of the intermediate semiconductor region 153 is later formed into the bottom semiconductor region 160 by further introducing an impurity. Before the bottom semiconductor region 160 is formed, the integrated value of the impurity concentration in the direction of thickness of the intermediate semiconductor region 153 is generally adjusted to $1 \times 10^{12}$ to $5 \times 10^{12}$ $cm^{-2}$. As a result, the amount of space charge of the intermediate semiconductor region 153 and the amount of space charge of the surface semiconductor region 154 are identical.

As described above, the peak impurity concentration of the intermediate semiconductor region 153 is located at the neighborhood 153a of the boundary surface between the intermediate semiconductor region 153 and the insulator film 130. The impurity concentration of the intermediate semiconductor region 153 at the neighborhood 153a of the boundary surface can also be adjusted to be greater than the impurity concentration at the surface side of the bottom semiconductor region 160. The impurity concentration of the part of the intermediate semiconductor region 153 located between the surface semiconductor region 154 and the bottom semiconductor region 160 is adjusted to be less than the impurity concentration of the bottom semiconductor region 160. The impurity concentration of a part of the intermediate semiconductor region 153 may also be adjusted to be greater than the impurity concentration of the bottom semiconductor region 160.

The source semiconductor region 182 is formed on a surface part of the p-type well semiconductor region 155, and is isolated from the intermediate semiconductor region 153 by the p-type well semiconductor region 155. The source semiconductor region 182 includes a high concentration of n-type impurity (typically phosphorus). The source semiconductor region 182 is electrically connected to the source electrode S. An isolating insulator film 184 is formed between the source semiconductor region 182 and the well-contacting semiconductor region 186.

The LDMOS 100 comprises a gate insulator film 174 and a gate electrode 176. The gate electrode 176 faces the p-type well semiconductor region 155 via the gate insulator film 174, this p-type well semiconductor region 155 isolating the source semiconductor region 182 and the intermediate semiconductor region 153.

The LDMOS 100 further comprises a field oxidized film 164. The field oxidized film 164 is formed on the surface of the semiconductor layer 140 between the n-type well semiconductor region 151 and the p-type well semiconductor region 155. A first planar electrode 166 is formed in a part of a surface of the field oxidized film 164 at the p-type well semiconductor region 155 side. The first planar electrode 166 is electrically connected to a gate electrode G. A second planar electrode 162 is formed in a part of a surface of the field oxidized film 164 at the n-type well semiconductor region 151 side. The second planar electrode 162 is electrically connected to the drain electrode D.

The operation and effects of increasing the withstand voltage of the LDMOS 100 are essentially the same as the operation and effects of the diode 10 of the first embodiment. That is, due to the LDMOS 100 comprising the surface semiconductor region 154, the intermediate semiconductor region 153, and the bottom semiconductor region 160, the LDMOS 100 shows a distribution of electrical field strength in the vertical direction of the semiconductor layer 140 that differs from that of the conventional structure. The strength of the electrical field formed in the vertical direction of the semiconductor layer 140 of the LDMOS 100 decreases abruptly from the boundary surface between the bottom semiconductor region 160 and the insulator film 130 toward the interior of the semiconductor layer 140. The strength of the electrical field formed in the vertical direction of the semiconductor layer 140 creates the phenomenon wherein a direction of the electrical field is inverted within the semiconductor layer 140. A magnitude of the electrical field is inverted between positive and negative within the semiconductor layer 140. With the LDMOS 100, the impurity concentration, and the shape of the bottom semiconductor region 160, the intermediate semiconductor region 153, and the surface semiconductor region 154 are adjusted so that the location at which the strength of the electrical field formed in the vertical direction of the semiconductor layer 140 becomes 0 is the boundary surface of the bottom semiconductor region 160 and the intermediate semiconductor region 153. In the electrical field formed in the vertical direction of the semiconductor layer 140, therefore, positive and negative strength is inverted between the bottom semiconductor region 160 and the intermediate semiconductor region 153. The bottom semiconductor region 160 has positive electrical field strength, and the intermediate semiconductor region 153 and the surface semiconductor region 154 have negative electrical field strength. As a result, although the electrons travel in a vertical direction within the bottom semiconductor region 160, the electrons cannot travel in a vertical direction within the intermediate semiconductor region 153 and the surface semiconductor region 154. Consequently, the distance that the carriers travel in the vertical direction within the semiconductor layer 140 can be restricted to the thickness T160 of the bottom semiconductor region 160. The avalanche breakdown occurs when the value of the ionization rate of the electrons integrated with respect to distance traveled, i.e. the ionization integral, reaches 1. With the LDMOS 100, the distance traveled by the electrons can be restricted to the thickness T160 of the bottom semiconductor region 160. As a result, the occurrence of the avalanche breakdown can be controlled by adjusting the thickness of the bottom semiconductor region 160. With the LDMOS 100, therefore, the occurrence of the avalanche breakdown can be controlled even if a critical electrical field at the boundary surface between the bottom semiconductor region 160 and the insulator film 130 is increased.

Since the occurrence of the avalanche breakdown is controlled in the LDMOS 100, the critical electrical field at the boundary surface between the bottom semiconductor region 160 and the insulator film 130 can be increased. The voltage that can be borne by the insulator film 130 per unit thickness becomes approximately three times the critical electrical field at the boundary surface between the bottom semiconductor region 160 and the insulator film 130. In the LDMOS 100, therefore, the voltage that can be borne by the insulator film 130 per unit thickness can be increased by increasing the critical electrical field. The voltage that can be borne by the insulator film 130 can thus be increased.

Other characteristics of the LDMOS 100 are listed below.

(1) The location at which the strength of the electrical field formed in the vertical direction of the semiconductor layer 140 becomes 0 has a strong relationship with the thickness T160 of the bottom semiconductor region 160. As a result, the thickness T160 of the bottom semiconductor region 160 is formed within a range of 0.5 µm. When the thickness of the bottom semiconductor region 160 is adjusted to be within 0.5 µm, the distance is reduced that the electrons travel in the vertical direction within the bottom semiconductor region 160, and the critical electrical field at the boundary surface between the bottom semiconductor region 160 and the insulator film 130 can be increased to 0.5 MV/cm or above. The critical electrical field with the conventional structure is generally in the range of 0.25 MV/cm to 0.4 MV/cm. If a critical electrical field 0.5 MV/cm or more can be obtained, the voltage that can be borne by the insulator film 130 per unit thickness can be made markedly greater than with the conventional structure. Further, it is more preferred that the thickness T160 of the bottom semiconductor region 160 is adjusted to be within 0.1 µm. When the thickness T160 of the bottom semiconductor region 160 is within 0.1 µm, the critical electrical field at the boundary surface can be increased to 0.65 MV/cm or above.

(2) The LDMOS 100 comprises the overlapping region 151a in which a portion of the n-type well semiconductor region 151 overlaps with a portion of the bottom semiconductor region 160. The impurity concentration of the overlapping region 151a is high. The overlapping region 51a is disposed below the drain semiconductor region 152. The overlapping region 151a can control an increase in the width of a depleted layer below the drain semiconductor region 152. The distance that the electrons travel across the depleted layer can be reduced by reducing the width of the depleted layer. As a result, the occurrence of the avalanche breakdown can be controlled. Consequently, the critical electrical field below the drain semiconductor region 152 can be increased, and the voltage that can be borne by the insulator film 130 per unit thickness can be increased.

(3) The impurity concentration of the bottom semiconductor region 160 decreases from the n-type well semiconductor region 151 side towards the p-type well semiconductor region 155 side. The bottom semiconductor region 160 that has this type of concentration distribution is suitable for obtaining the RESURF effect between the n-type well semiconductor region 151 and the p-type well semiconductor region 155. That is, the bottom semiconductor region 160 that has this type of concentration distribution is formed to work against a capacitor for a MOS structure formed from the semiconductor substrate 120, the insulator film 130, and the semiconductor layer 140. The bottom semiconductor region 160 is formed to cancel the amount of negative space charge accumulated in the capacitor of the MOS structure in a non conducting state. As a result, when the LDMOS 100 is in an off state, the sum of the amount of positive space charge when the intermediate semiconductor region 153 has been depleted and the amount of positive space charge when the bottom semiconductor region 160 has been depleted is identical with the sum of the amount of negative space charge when the surface semiconductor region 154 has been depleted and the amount of negative space charge accumulated in the capacitor of the MOS structure. In the LDMOS 100, the amounts are mutually offset of positive space charge and negative space charge included in a vertically extending range of the semiconductor layer 140, this semiconductor layer 140 comprising the stacked bottom semiconductor region 160, intermediate semiconductor region 153, and surface semiconductor region 154. The potential distribution between the n-type well semiconductor region 151 and the p-type well semiconductor region 155 can thus be caused to have a uniform state when the LDMOS 100 is off. The phenomenon can consequently be controlled in which the electrical field is concentrated locally, and the withstand voltage of the LDMOS 100 can be increased.

(4) The bottom semiconductor region 160 is formed by utilizing an ion injection technique. Further, excessive thermal diffusion (this refers to a thermal process of 950° C. or above) is not performed on the bottom semiconductor region 160 after the ions have been injected. As a result, the impurity distribution in the vertical direction in the bottom semiconductor region 160 is formed in an extremely steep state. Because thermal diffusion is not performed, the thickness T160 in the vertical direction of the bottom semiconductor region 160 can be made extremely thin. Since the thickness T160 of the bottom semiconductor region 160 is extremely thin, the distance that the electrons travel in the vertical direction can be reduced, and occurrence of the avalanche breakdown can be controlled.

(Manufacturing Method of the LDMOS 100)

The manufacturing method of the LDMOS 100 will be described below with reference to FIGS. 5 to 12. The LDMOS 100 can realize a withstand voltage of approximately 2400V. In describing the manufacturing method of the LDMOS 100, the method of manufacturing the bottom semiconductor region 160 will chiefly be described. The manufacturing method of the bottom semiconductor region 160 is not restricted to the bottom semiconductor region 160 of the LDMOS 100, but can also be utilized in manufacturing the bottom semiconductor region 60 of the diode 10, and in manufacturing a bottom semiconductor region 260 of an LDMOS 200 (to be described).

Figure 5:
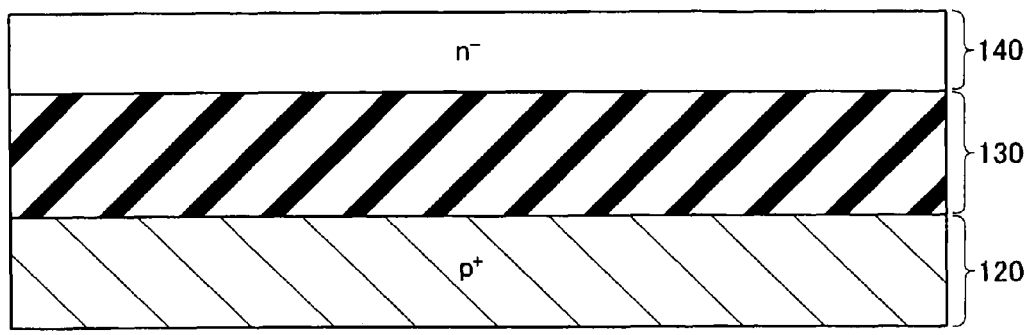
FIG. 5 shows a manufacturing process (1) of the LDMOS of the second embodiment.

First, as shown in FIG. 5, the SOI substrate is prepared, wherein the semiconductor substrate 120, the insulator film 130, and the semiconductor layer 140 are stacked. The SOI substrate can be manufactured using the following procedure. First, wet oxidation is performed of the semiconductor substrate 120 that includes a high concentration of p-type impurity, and the insulator film 130 having a thickness of 12 μm is formed on the surface of the semiconductor substrate 120. The wet oxidation conditions are set to be 1200° C. for 400 hours.

Next, the semiconductor layer 140 that has a specific resistance of 4.5? cm is bonded to the surface of the insulator film 130. The insulator film 130 and the semiconductor layer 140 can be firmly bonded by means of a thermal process at 1100° C. for 1 hour.

Next, the semiconductor layer 140 is polished from its surface to adjust the thickness of the semiconductor layer 140 to 1.4 μm. The SOI substrate is manufactured by performing the above steps.

Figure 6:
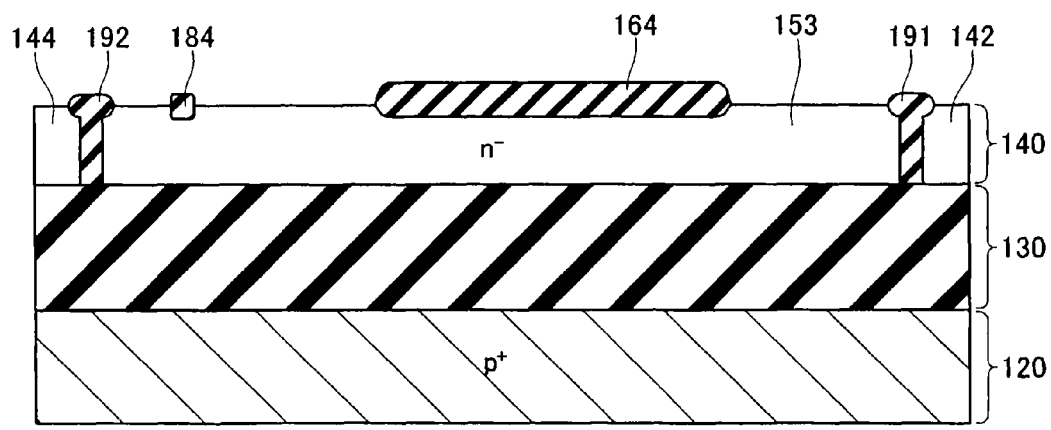
FIG. 6 shows the manufacturing process (2) of the LDMOS of the second embodiment.

Next, as shown in FIG. 6, insulating isolating trenches 191 and 192 are formed in the field oxidized film 164 and the isolating insulator film 184. From a plan view, the insulating isolating trenches 191 and 192 form a loop within the semiconductor layer 140. The insulating isolating trenches 191 and 192 insulate and isolate one portion of the semiconductor layer 140 from the remaining portion of the semiconductor layer 140, forming an island shaped region. In this example, the insulating isolating trenches 191 and 192 insulate and isolate region 153 in the semiconductor layer 140 in which the LDMOS 100 is formed from the remaining regions 142 and 144 of the semiconductor layer 140. The remaining regions 142 and 144 have other semiconductor elements formed therein (for example, a low withstand voltage NMOS, a low withstand voltage PMOS), etc. Specifically, the insulating isolating trenches 191 and 192, the field oxidized film 164 and the isolating insulator film 184 are manufactured using the following procedure. First, the lithography technique and the etching technique are utilized to etch a trench in a loop in the semiconductor layer 140. The trench reaches from the surface of the semiconductor layer 140 to the bottom surface of the semiconductor layer 140, and has a width of 0.4 μm. Next, wet oxidation is executed to selectively form the field oxidized film 164 and the isolating insulator film 184 at the surface of the semiconductor layer 140. At this juncture, a thermal oxidized film is also formed from an inner wall of the trench, and consequently the interior of the trench is also filled with the thermal oxidized film, thus forming the insulating isolating trenches 191 and 192.

Figure 7:
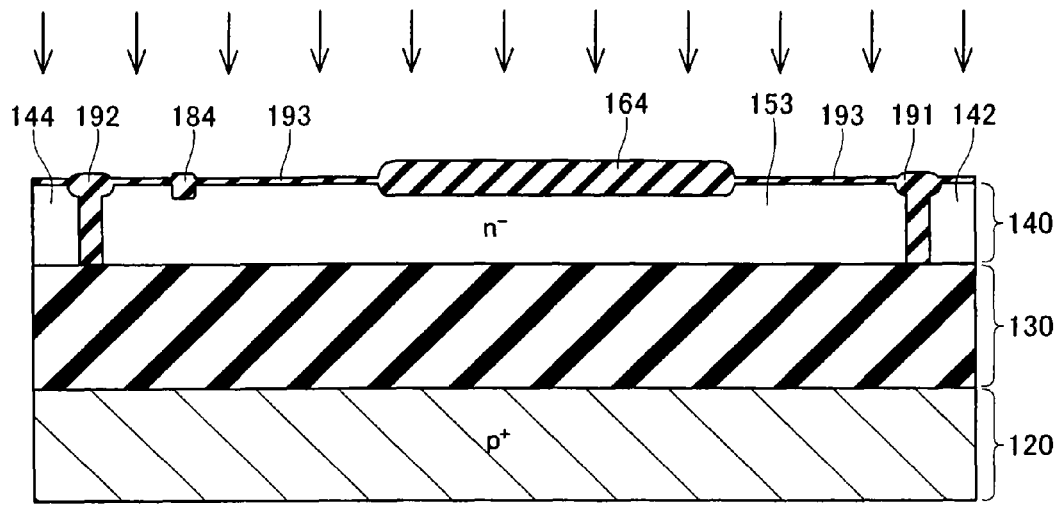
FIG. 7 shows the manufacturing process (3) of the LDMOS of the second embodiment.

Next, as shown in FIG. 7, a thin sacrificial oxidized film 193 is formed on the entirety of the surface of the semiconductor layer 140. Then ion injection of phosphorus is performed toward a bottom surface portion of the semiconductor layer 140 (this bottom surface portion may be referred to as a portion at the bottom surface side of the semiconductor layer 140, or the neighborhood of the boundary surface between the semiconductor sub layer 140 and the insulator film 130). The ion injection conditions are 1.4 MeV, $3 \times 10^{12}$ cm$^{-2}$. The peak impurity concentration is consequently at the bottom surface portion of the semiconductor layer 140, and a concentrated area (not shown) can be formed that has a steep impurity distribution in the vertical direction. This concentrated area consists of the intermediate semiconductor region 153 and the bottom semiconductor region 160. In particular, the concentrated area is formed by means of combining an impurity introduced in a later step such that the bottom semiconductor region 160 is formed in part of the bottom of the semiconductor layer 140. The bottom semiconductor region 160 can have an extremely steep vertical impurity distribution.

Figure 8:
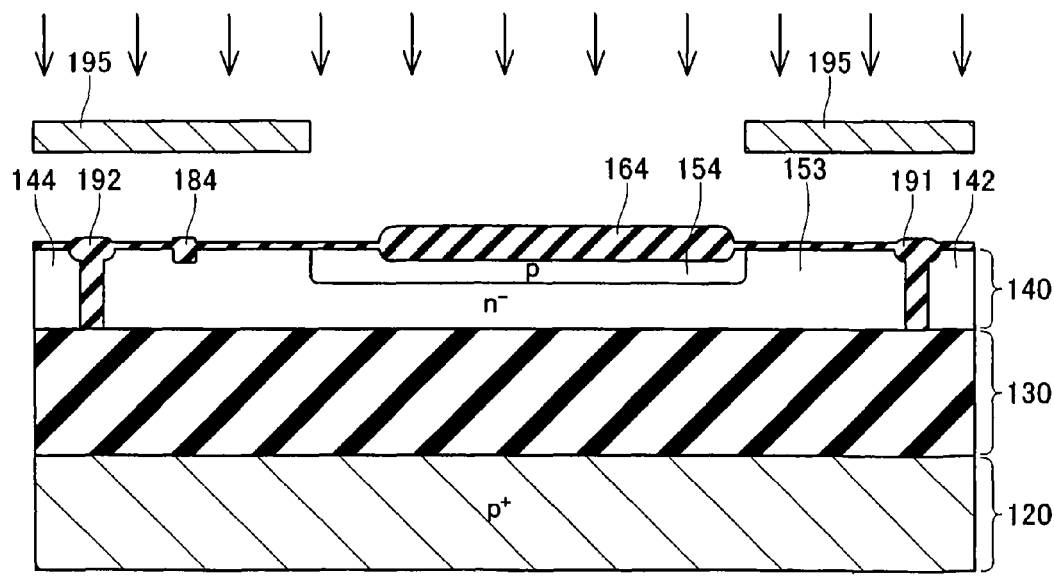
FIG. 8 shows the manufacturing process (4) of the LDMOS of the second embodiment.

Next, as shown in FIG. 8, the surface semiconductor region 154 is formed in a surface part of the semiconductor substrate 140. The surface semiconductor region 154 is formed selectively in the surface part of the semiconductor substrate 140 directly below the field oxidized film 164. Specifically, the surface semiconductor region 154 can be manufactured using the following procedure. First, the lithography technique is utilized to form a photo resist 195 that has an opening in the portion where the surface semiconductor region 154 is to be formed. Next, ion injection of boron is performed through the opening in the photo resist 195. The ion injection conditions are 300 KeV, $3 \times 10^{12}$ cm$^{-2}$. The surface semiconductor region 154 can thus be formed at the surface part of the semiconductor substrate 140.

Next, the step for manufacturing the bottom semiconductor region 160 will be described with reference to FIGS. 9 to 11. The bottom semiconductor region 160 has the plurality of part regions 161 to 167 that have differing impurity concentrations. The bottom semiconductor region 160 is formed by using a plurality of differently shaped photo resists 196, 197, and 198 (examples of masks) to introduce, at differing times, impurity of differing concentrations into the semiconductor substrate 140. In this impurity introducing step, the three photo resists 196, 197, and 198 are utilized, and the amount of impurity introduced into each of the photo resists 196, 197, and 198 is increased by powers of 2, resulting in the formation of $2^3$, i.e. eight regions with differing impurity. The eight regions are a region into which impurity is not introduced and the seven part regions 161 to 167. The bottom semiconductor region 160 that has the seven part regions 161 to 167 can be formed utilizing the three photo resists 196, 197, and 198. Utilizing the three photo resists 196, 197, and 198 to form the seven part regions 161 to 167 is an ion injection technique that has utility.

Figure 9:
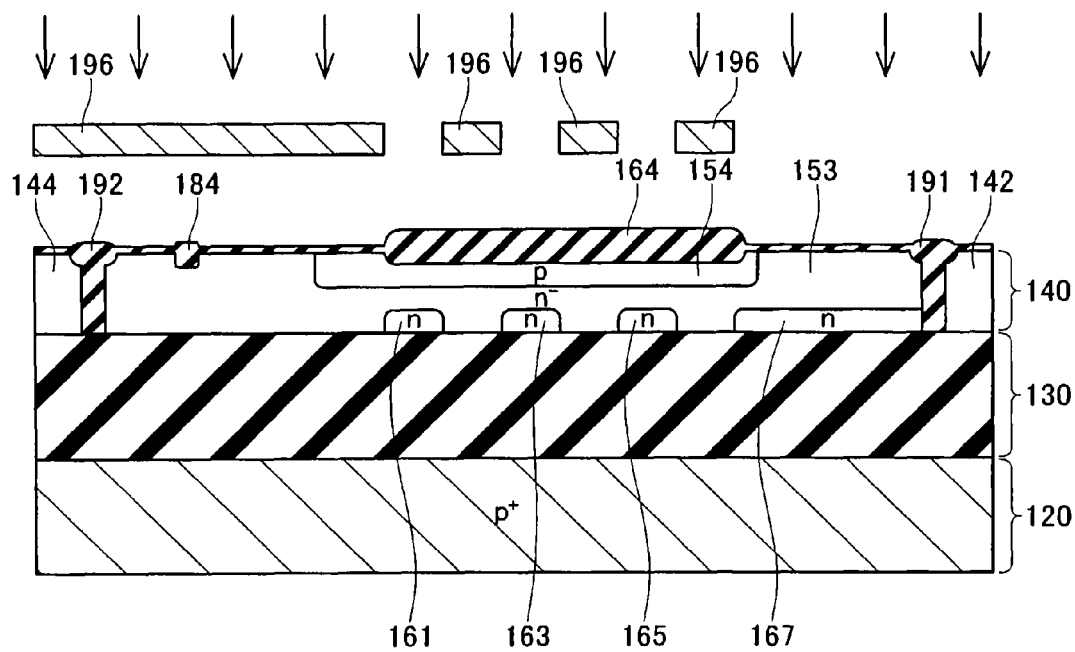
FIG. 9 shows the manufacturing process (5) of the LDMOS of the second embodiment.

First, as shown in FIG. 9, the first photo resist 196 is used for the ion injection of phosphorus into regions that correspond to the first part region 161, the third part region 163, the fifth part region 165, and the seventh part region 167. The ion injection conditions are 1.4 MeV, $5 \times 10^{11}$ cm$^{-2}$.

Figure 10:
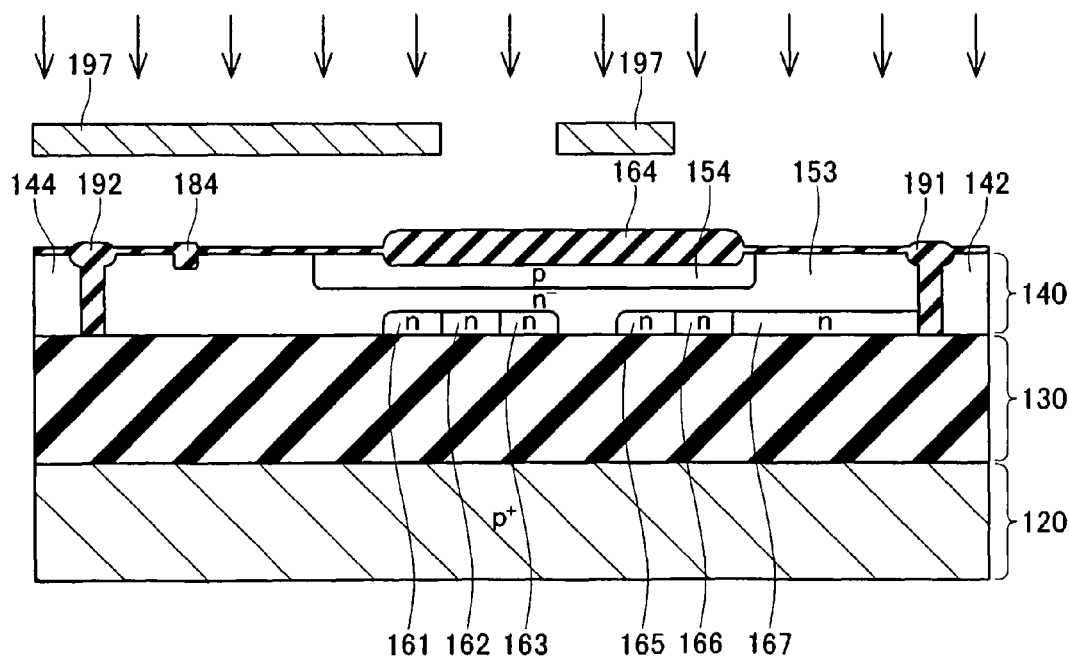
FIG. 10 shows the manufacturing process (6) of the LDMOS of the second embodiment.

Next, as shown in FIG. 10, the second photo resist 197 is used for the ion injection of phosphorus into regions that correspond to the second part region 162, the third part region 163, the sixth part region 166, and the seventh part region 167. The ion injection conditions are 1.4 MeV, $1 \times 10^{12}$ cm$^{-2}$.

Figure 11:
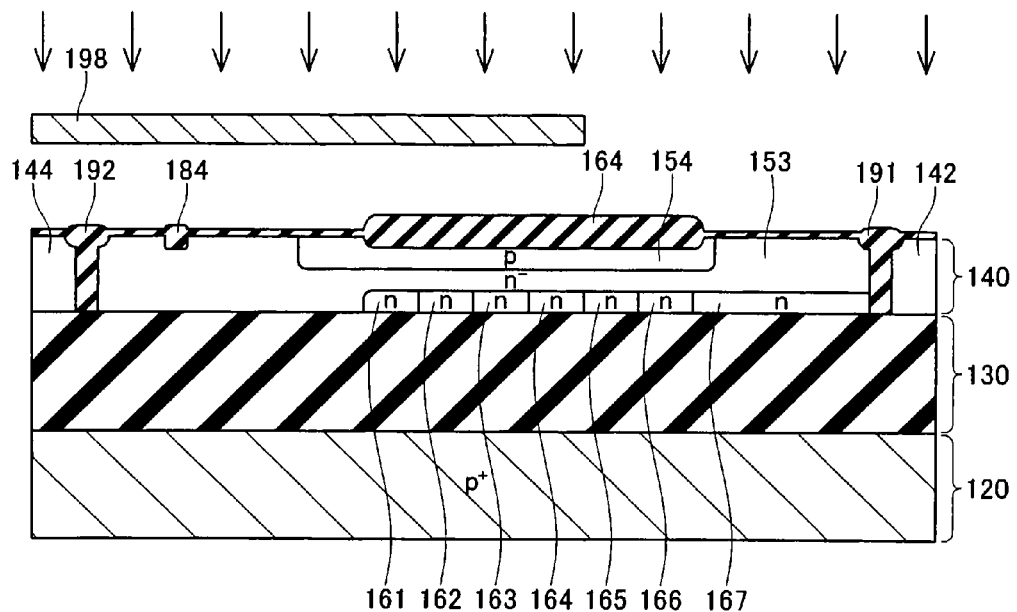
FIG. 11 shows the manufacturing process (7) of the LDMOS of the second embodiment.

Next, as shown in FIG. 11, the third photo resist 198 is used for the ion injection of phosphorus into regions that correspond to the fifth part region 165, the sixth part region 166, and the seventh part region 167. The ion injection conditions are 1.4 MeV, $2 \times 10^{12}$ cm$^{-2}$.

With the above three ion injection steps, $5 \times 10^{11}$ cm$^{-2}$ of phosphorus is introduced into the first part region 161, $1 \times 10^{12}$ cm$^{-2}$ of phosphorus is introduced into the second part region 162, $1.5 \times 10^{12}$ cm$^{-2}$ of phosphorus is introduced into the third part region 163, $2 \times 10^{12}$ cm$^{-2}$ of phosphorus is introduced into the fourth part region 164, $2.5 \times 10^{12}$ cm$^{-2}$ of phosphorus is introduced into the fifth part region 165, $3 \times 10^{12}$ cm$^{-2}$ of phosphorus is introduced into the sixth part region 166, and $3.5 \times 10^{12}$ cm$^{-2}$ of phosphorus is introduced into the seventh part region 167. As a result, the impurity concentration of the bottom semiconductor region 160 has a distribution that increases from the left side toward the right side with respect to the plane of the paper.

In the manufacturing method of the bottom semiconductor region 160, the bottom semiconductor region 160 can be formed using the photo resists 196, 197, and 198 that are fewer in number than the part regions 161 to 167. The bottom semiconductor region 160, which has the plurality of part regions 161 to 167 having differing impurity concentrations, can consequently be manufactured at low cost.

Figure 12:
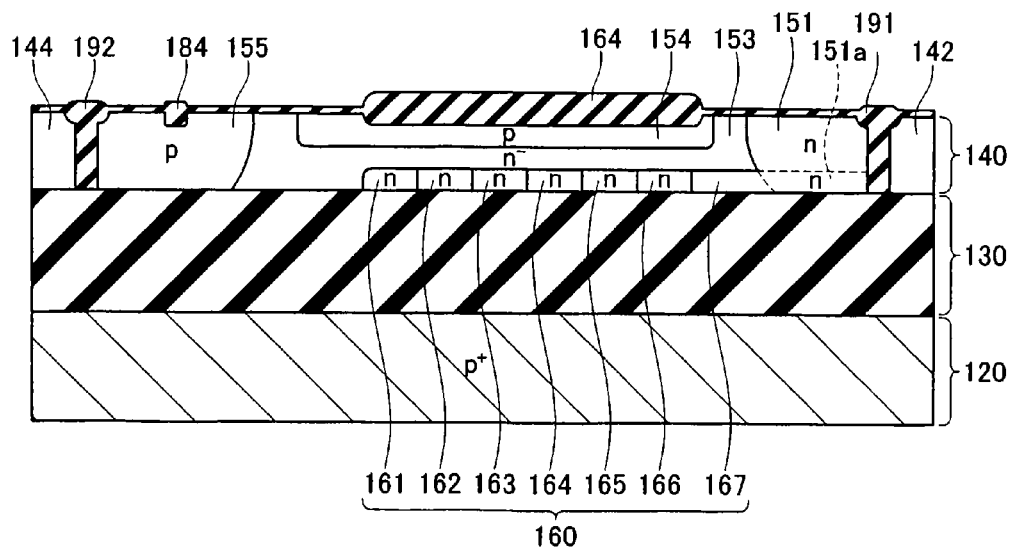
FIG. 12 shows the manufacturing process (8) of the LDMOS of the second embodiment.

Next, as shown in FIG. 12, the lithography technique and the ion injection technique are utilized to form the n-type well semiconductor region 151 and the p-type well semiconductor region 155. The n-type well semiconductor region 151 and the p-type well semiconductor region 155 are manufactured using a low temperature process in which ion injection is performed a plurality of times. The n-type well semiconductor region 151 and the p-type well semiconductor region 155 are formed from the surface of the semiconductor substrate 140 to the insulator film 130. The overlapping region 151a is thus formed in which the n-type well semiconductor region 151 and the bottom semiconductor region 160 overlap. The impurity concentration of the overlapping region 151a is the sum of the impurity concentration of the n-type well semiconductor region 151 and the seventh part region 167.

A step of forming the surface structure after this step can be a normal CMOS manufacturing step. The LDMOS 100 shown in FIG. 4 can thus be manufactured merely by adding small steps to the standard CMOS process.

THIRD EMBODIMENT

Figure 13:
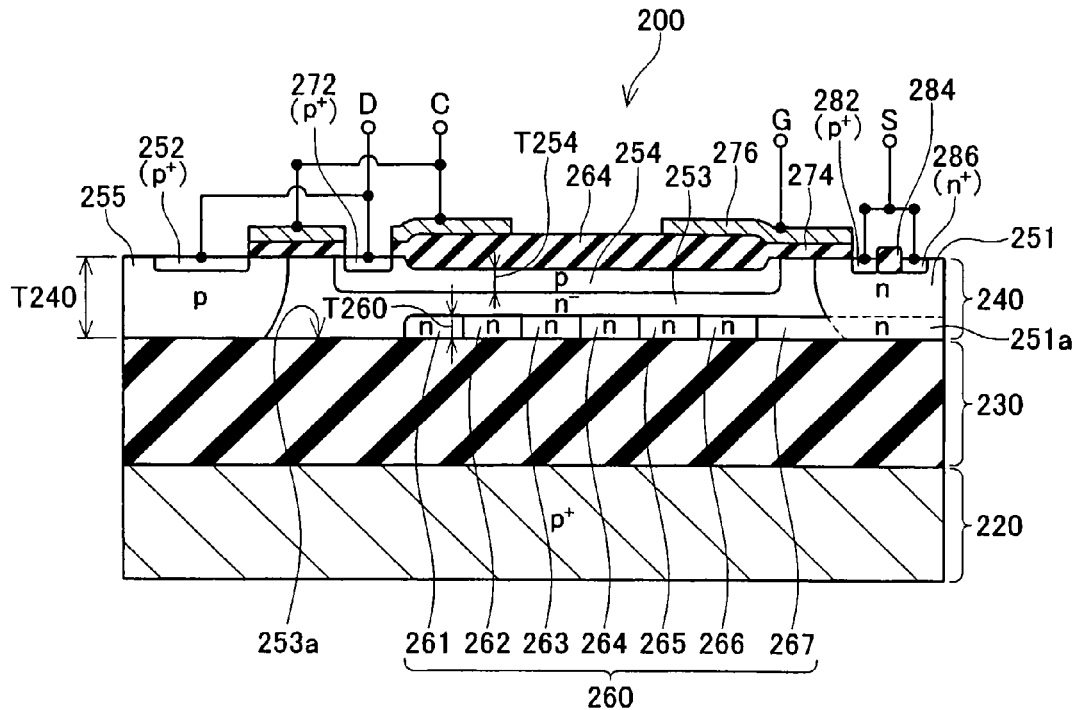
FIG. 13 schematically shows a cross-sectional view of essential parts of an LDMOS of a third embodiment.
Figure 14:
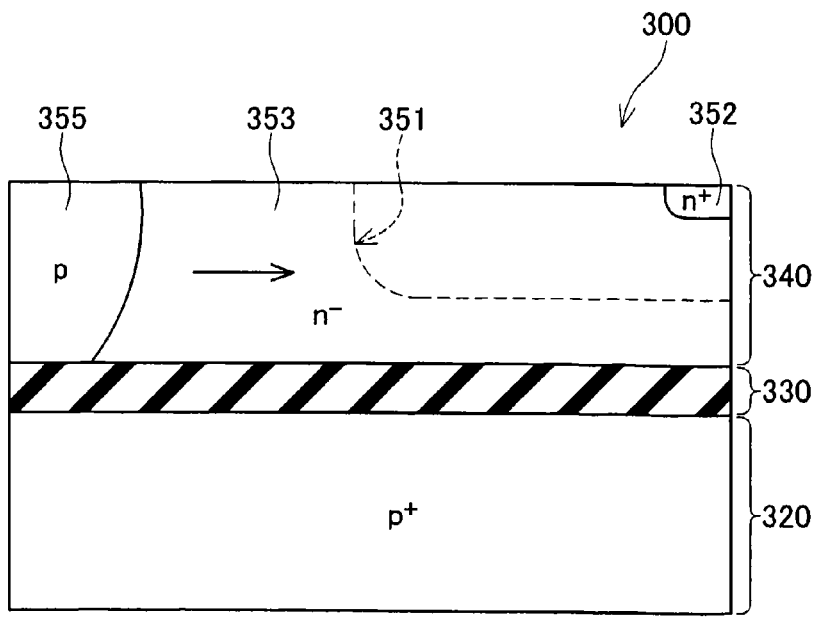
FIG. 14 schematically shows a cross-sectional view of essential parts of a diode of a conventional embodiment.

FIG. 13 schematically shows a cross-sectional view of essential parts of a lateral p-type channel LDMOS 200. The LDMOS 200 comprises a monocrystal silicon semiconductor substrate 220 that includes a high concentration of p-type impurity, a silicon oxide ($SiO_2$) insulator film 230 formed on the semiconductor substrate 220, and a monocrystal silicon semiconductor layer 240 formed on the insulator film 230. A thickness T240 of the semiconductor layer 240 is generally adjusted to 0.4 to 2 μm. The semiconductor substrate 220 may include a high concentration of n-type impurity (typically phosphorus). The semiconductor substrate 220 can essentially be considered a conductor.

The semiconductor layer 240 comprises an n-type well semiconductor region 251, a p-type well semiconductor region 255, a surface semiconductor region 254, a bottom semiconductor region 260, an intermediate semiconductor region 253, and a source semiconductor region 282.

The n-type well semiconductor region 251 is formed in a portion of the semiconductor layer 240, and includes an impurity of n-type (typically phosphorus). The impurity concentration of the n-type well semiconductor region 251 is generally adjusted to $5 \times 10^{16}$ to $5 \times 10^{17}$ $cm^{-3}$. A well-contacting semiconductor region 286 that includes a high concentration of n-type impurity (typically phosphorus) is provided in a surface part of the n-type well semiconductor region 251. The well-contacting semiconductor region 286 can be considered a part of the n-type well semiconductor region 251. The impurity concentration of the well-contacting semiconductor region 286 is generally adjusted to $1 \times 10^{19}$ to $1 \times 10^{22}$ cm$^{-3}$. The n-type well semiconductor region 251 is electrically connected to a source electrode S via the well-contacting semiconductor region 286. The n-type well semiconductor region 251 extends from a surface of the semiconductor layer 240 to the insulator film 230. The LDMOS 200 comprises an overlapping region 251a in which a portion of the n-type well semiconductor region 251 overlaps with a portion of the bottom semiconductor region 260.

The p-type well semiconductor region 255 is formed in a portion of the semiconductor layer 240, and is in a location away from the n-type well semiconductor region 251. The p-type well semiconductor region 255 includes an impurity of p-type (typically boron). The impurity concentration of the p-type well semiconductor region 255 is generally adjusted to $5 \times 10^{16}$ to $5 \times 10^{17}$ cm$^{-3}$. A well-contacting semiconductor region 252 that includes a high concentration of p-type impurity (typically boron) is provided in a surface part of the p-type well semiconductor region 255. The impurity concentration of the well-contacting semiconductor region 252 is generally adjusted to $1 \times 10^{19}$ to $1 \times 10^{22}$ cm$^{-3}$. The well-contacting semiconductor region 252 can be considered a part of the p-type well semiconductor region 255. The p-type well semiconductor region 255 is electrically connected to the drain electrode D via the well-contacting semiconductor region 252. The p-type well semiconductor region 255 extends from a surface of the semiconductor layer 240 to a bottom face thereof. The p-type well semiconductor region 255 makes contact with the insulator film 230.

The surface semiconductor region 254 is formed in a portion of the surface of the semiconductor layer 240, and is located between the n-type well semiconductor region 251 and the p-type well semiconductor region 255. The surface semiconductor region 254 includes an impurity of p-type (typically boron). The integrated value of the impurity concentration in the direction of thickness of the surface semiconductor region 254 is generally adjusted to $1 \times 10^{12}$ to $5 \times 10^{12}$ cm$^{-2}$. A thickness T254 of the surface semiconductor region 254 is generally adjusted to 0.1 to 1 μm. A drain semiconductor region 272 is formed in a surface part of the surface semiconductor region 254. The impurity concentration of the drain semiconductor region 272 is generally adjusted to $1 \times 10^{19}$ to $1 \times 10^{22}$ cm$^{-3}$. The surface semiconductor region 254 is electrically connected to the drain electrode D via the drain semiconductor region 272.

The bottom semiconductor region 260 is formed in a portion of a bottom surface of the semiconductor layer 240, is in a location away from the surface semiconductor region 254, and is located between the n-type well semiconductor region 251 and the p-type well semiconductor region 255. The bottom semiconductor region 260 makes contact with the n-type well semiconductor region 251, and is away from the p-type well semiconductor region 255. The bottom semiconductor region 260 includes an impurity of n-type (typically phosphorus). The impurity concentration of the bottom semiconductor region 260 decreases from the boundary surface between the bottom semiconductor region 260 and the insulator film 230 towards a surface side of the bottom semiconductor region 260. The impurity concentration of the bottom semiconductor region 260 defines the thickness T260 of the bottom semiconductor region 260. The thickness T260 of the bottom semiconductor region 260 is a distance from the boundary surface between the bottom semiconductor region 260 and the insulator film 230 to the location where the impurity concentration of the bottom semiconductor region 260 is one tenth or less of the impurity concentration at the boundary surface between the bottom semiconductor region 260 and the insulator film 230. The thickness T260 of the bottom semiconductor region 260 is generally adjusted to 0.5 μm or less. The bottom semiconductor region 260 comprises seven part regions 261 to 267. The part regions 261 to 267 each have a unique impurity concentration. The impurity concentration of the part regions 261 to 267 decreases from the n-type well semiconductor region 251 side toward the p-type well semiconductor region 255 side. Each of the part regions 261 to 267 has a greater impurity concentration than the impurity concentration of the intermediate semiconductor region 253. The impurity concentration of the part regions 261 to 267 increases by an integral multiple. The integrated value of the impurity concentration in the direction of thickness of the part region 267, this having the greatest impurity concentration, is generally adjusted to $1 \times 10^{12}$ to $5 \times 10^{12}$ cm$^{-2}$. Further, as described above, a portion of the n-type well semiconductor region 251 overlaps with a portion of the bottom semiconductor region 260, forming the overlapping region 251a. As a result, the impurity concentration in the overlapping region 251a is extremely high.

The intermediate semiconductor region 253 is formed in the semiconductor layer 240 between the surface semiconductor region 254 and the bottom semiconductor region 260, and makes contact with the n-type well semiconductor region 251 and the p-type well semiconductor region 255. The intermediate semiconductor region 253 includes a low concentration of n-type impurity (typically phosphorus). The impurity concentration of a part of the intermediate semiconductor region 253 located between the surface semiconductor region 254 and the bottom semiconductor region 260 is less than the impurity concentration of the bottom semiconductor region 260. Further, the impurity concentration of the intermediate semiconductor region 253 decreases from the bottom surface side toward the top surface side. As described above, the intermediate semiconductor region 253 is formed by introducing an impurity into the semiconductor layer 240. The impurity is introduced toward a neighborhood 253a of the boundary surface between the semiconductor layer 240 and the insulator film 230. Consequently, the peak impurity concentration of the intermediate semiconductor region 253 is located at the neighborhood 253a of the boundary surface with the insulator film 230. A part of the intermediate semiconductor region 253 is later formed into the bottom semiconductor region 260 by further introducing an impurity. Before the bottom semiconductor region 260 is formed, the integrated value of the impurity concentration in the direction of thickness of the intermediate semiconductor region 253 is generally adjusted to $1 \times 10^{12}$ to $5 \times 10^{12}$ cm$^{-2}$. As a result, the amount of charge of the intermediate semiconductor region 253 and the amount of charge of the surface semiconductor region 254 are identical.

As described above, the peak impurity concentration of the intermediate semiconductor region 253 is located at the neighborhood 253a of the boundary surface between the intermediate semiconductor region 253 and the insulator film 230. The impurity concentration of the intermediate semiconductor region 253 at the neighborhood 253a of the boundary surface can also be adjusted to be greater than the impurity concentration at the surface side of the bottom semiconductor region 260. The impurity concentration of the part of the intermediate semiconductor region 253 located between that of the surface semiconductor region 254 and the bottom semiconductor region 260 is adjusted to be less than the impurity concentration of the bottom semiconductor region 260. The impurity concentration of a part of the intermediate semiconductor region 253 may also be adjusted to be greater than the impurity concentration of the bottom semiconductor region 260. The source semiconductor region 282 is formed on a surface part of the n-type well semiconductor region 251, and is isolated from the intermediate semiconductor region 253 by the n-type well semiconductor region 251. The source semiconductor region 282 includes a high concentration of n-type impurity (typically phosphorus). The source semiconductor region 282 is electrically connected to the source electrode S. An isolating insulator film 284 is formed between the n-type well semiconductor region 251 and the well-contacting semiconductor region 286.

The LDMOS 200 comprises a gate insulator film 274 and a gate electrode 276. The gate electrode 276 faces the n-type well semiconductor region 251 and the intermediate semiconductor region 253 via the gate insulator film 274, this n-type well semiconductor region 251 and the intermediate semiconductor region 253 isolating the source semiconductor region 282 and the surface semiconductor region 254.

The LDMOS 200 further comprises a field oxidized film 264. The field oxidized film 264 is formed on the surface of the semiconductor layer 240 between the n-type well semiconductor region 251 and the p-type well semiconductor region 255. A portion of the gate electrode 276 extends to a portion of a surface of the field oxidized film 264 at an n-type well semiconductor region 251 side thereof.

The LDMOS 200 further comprises a control electrode C. The control electrode C is formed in a part of a surface of the field oxidized film 264 at a p-type well semiconductor region 255 side thereof. A predetermined voltage is applied to the control electrode C so that a parasitic MOS structure does not operate between the p-type well semiconductor region 255 and the surface semiconductor region 254.

The operation and effects of increasing the withstand voltage of the LDMOS 200 are essentially the same as the operation and effects of the diode 10 of the first embodiment and the LDMOS 200 of the second embodiment. That is, due to the LDMOS 200 comprising the surface semiconductor region 254, the intermediate semiconductor region 253, and the bottom semiconductor region 260, the LDMOS 200 shows a distribution of electrical field strength in the vertical direction of the semiconductor layer 240 that differs from that of the conventional structure. The strength of the electrical field formed in the vertical direction of the semiconductor layer 240 of the LDMOS 200 decreases abruptly from the boundary surface between the bottom semiconductor region 260 and the insulator film 230 toward the interior of the semiconductor layer 240. The strength of the electrical field formed in the vertical direction of the semiconductor layer 240 creates the phenomenon wherein a direction of the electrical field is inverted within the semiconductor layer 240. A magnitude of the electrical field is inverted between positive and negative within the semiconductor layer 240. With the LDMOS 200, the impurity concentration, and the shape of the bottom semiconductor region 260, the intermediate semiconductor region 253, and the surface semiconductor region 254 are adjusted so that the location at which the strength of the electrical field formed in the vertical direction of the semiconductor layer 240 becomes 0 is the boundary surface of the bottom semiconductor region 260 and the intermediate semiconductor region 253. In the electrical field formed in the vertical direction of the semiconductor layer 240, therefore, positive and negative strength is inverted between the bottom semiconductor region 260, and the intermediate semiconductor region 253. The bottom semiconductor region 260 has positive electrical field strength, and the intermediate semiconductor region 253 and the surface semiconductor region 254 have negative electrical field strength. As a result, although the electrons travel in a vertical direction within the bottom semiconductor region 260, the electrons cannot travel in a vertical direction within the intermediate semiconductor region 253 and the surface semiconductor region 254. Consequently, the distance that the electrons travel in the vertical direction within the semiconductor layer 240 can be restricted to the thickness T260 of the bottom semiconductor region 260. The avalanche breakdown occurs when the value of the ionization rate of the electrons integrated with respect to distance traveled, i.e. the ionization integral, reaches 1. With the LDMOS 200, the distance traveled by the electrons can be restricted to the thickness T260 of the bottom semiconductor region 260. As a result, the occurrence of the avalanche breakdown can be controlled by adjusting the thickness T260 of the bottom semiconductor region 260. With the LDMOS 200, therefore, the occurrence of the avalanche breakdown can be controlled even if a critical electrical field is increased where the bottom semiconductor region 260 and the insulator film 230 make contact.

Since the occurrence of the avalanche breakdown is controlled in the LDMOS 200, the critical electrical field at the boundary surface between the bottom semiconductor region 260 and the insulator film 230 can be increased. The voltage that can be borne by the insulator film 230 per unit thickness becomes approximately three times the critical electrical field at the boundary surface between the bottom semiconductor region 260 and the insulator film 230. In the LDMOS 200, therefore, the voltage that can be borne by the insulator film 230 per unit thickness can be increased by increasing the critical electrical field. The voltage that can be borne by the insulator film 230 can thus be increased.

Other characteristics of the LDMOS 200 are listed below.

(1) The location at which the strength of the electrical field formed in the vertical direction of the semiconductor layer 240 becomes 0 has a strong relationship with the thickness T260 of the bottom semiconductor region 260. The thickness T260 of the bottom semiconductor region 260 is formed within a range of 0.5 µm. When the thickness of the bottom semiconductor region 260 is adjusted to be within 0.5 µm, the distance is reduced that the electrons travel in the vertical direction within the bottom semiconductor region 260, and the critical electrical field at the boundary surface between the bottom semiconductor region 260 and the insulator film 230 can be increased to 0.5 MV/cm or above. Generally the critical electrical field with the conventional structure is in the range of 0.25 MV/cm to 0.4 MV/cm. If a critical electrical field 0.5 MV/cm or more can be obtained, the voltage that can be borne by the insulator film 230 per unit thickness can be made markedly greater than with the conventional structure. Further, it is more preferred that the thickness T260 of the bottom semiconductor region 260 is adjusted to be within 0.1 µm. When the thickness T260 of the bottom semiconductor region 260 is within 0.1 µm, the critical electrical field at the boundary surface can be increased to 0.65 MV/cm or above.

(2) The LDMOS 200 comprises the overlapping region 251a in which a portion of the n-type well semiconductor region 251 overlaps with a portion of the bottom semiconductor region 260. The impurity concentration of the overlapping region 251a is high. The overlapping region 251a is disposed below the source semiconductor region 252, and can control an increase in the width of a depleted layer below the source semiconductor region 252. The distance that the electrons travel across the depleted layer can be reduced by reducing the width of the depleted layer. As a result, the occurrence of the avalanche breakdown can be controlled. Consequently, the critical electrical field below the source semiconductor region 252 can be increased, and the voltage that can be borne by the insulator film 230 per unit thickness can be increased.

(3) The impurity concentration of the bottom semiconductor region 260 decreases from the n-type well semiconductor region 251 side towards the p-type well semiconductor region 255 side. The bottom semiconductor region 260 that has this type of concentration distribution is suitable for obtaining the RESURF effect between the n-type well semiconductor region 251 and the p-type well semiconductor region 255. That is, the bottom semiconductor region 260 that has this type of concentration distribution is formed to work against a capacitor for a MOS structure formed from the semiconductor substrate 220, the insulator film 230, and the semiconductor layer 240. The bottom semiconductor region 260 is formed to cancel the amount of negative space charge accumulated in the capacitor of the MOS structure in a non conducting state. As a result, when the LDMOS 200 is in an off state, the sum of the amount of positive space charge when the intermediate semiconductor region 253 has been depleted and the amount of positive space charge when the bottom semiconductor region 260 has been depleted is identical with the sum of the amount of negative space charge when the surface semiconductor region 254 has been depleted and the amount of negative space charge accumulated in the capacitor of the MOS structure. In the LDMOS 200, the amounts are mutually offset of positive space charge and negative space charge included in a vertically extending range of the semiconductor layer 240, this semiconductor layer 240 comprising the stacked bottom semiconductor region 260, intermediate semiconductor region 253, and surface semiconductor region 254. The potential distribution between the n-type well semiconductor region 251 and the p-type well semiconductor region 255 can thus be caused to have a uniform state when the LDMOS 200 is off. The phenomenon can consequently be controlled in which the electrical field is concentrated locally, and the withstand voltage of the LDMOS 200 can be increased.

(4) The bottom semiconductor region 260 is formed by utilizing an ion injection technique. Further, excessive thermal diffusion (this refers to a thermal process of 950° C. or above) is not performed on the bottom semiconductor region 260 after the ions have been injected. As a result, the impurity distribution in the vertical direction in the bottom semiconductor region 260 is formed in an extremely steep state. Because thermal diffusion is not performed, the thickness T260 in the vertical direction of the bottom semiconductor region 260 can be made extremely thin. Since the thickness T260 of the bottom semiconductor region 260 is extremely thin, the distance that the electrons travel in the vertical direction can be reduced, and the occurrence of the avalanche breakdown can be controlled.

Specific examples of embodiments of the present invention are presented above, but these are merely examples and do not restrict the claims thereof. The art set forth in the claims includes various transformations and modifications to the specific examples set forth above.

Furthermore, the technical elements disclosed in the present specification or figures have technical utility both separately and in all types of conjunctions and are not limited to the conjunctions set forth in the claims at the time of submission of the application. Furthermore, the art disclosed in the present specification or figures may be utilized to simultaneously realize a plurality of aims or to realize one of these aims.

The invention claimed is:

1. A lateral semiconductor device comprising:
    a semiconductor substrate;
    an insulator film formed on the semiconductor substrate; and
    a semiconductor layer formed on the insulator film, the semiconductor layer comprising:
        a first semiconductor region formed in a portion of the semiconductor layer, including an impurity of a first conductive type, and being electrically connected to a first main electrode;
        a second semiconductor region formed in the other portion of the semiconductor layer, being away from the first semiconductor region, including an impurity of a second conductive type, and being electrically connected to a second main electrode;
        a surface semiconductor region formed in the surface portion of the semiconductor layer between the first semiconductor region and the second semiconductor region, including an impurity of the second conductive type, and being electrically connected to the second main electrode;
        a bottom semiconductor region formed in the bottom portion of the semiconductor layer between the first semiconductor region and the second semiconductor region, being away from the surface semiconductor region, and including an impurity of the first conductive type; and
        an intermediate semiconductor region formed in a portion of the semiconductor layer between the surface semiconductor region and the bottom semiconductor region, making contact with the first semiconductor region and the second semiconductor region, and including an impurity of the first conductive type,
        wherein the impurity concentration of the bottom semiconductor region is higher than the impurity concentration of the intermediate semiconductor region,
        the impurity concentration of the bottom semiconductor region decreases from a boundary surface between the bottom semiconductor region and the insulator film towards a boundary surface between the bottom semiconductor region and the intermediate semiconductor region, and
        the location where the impurity concentration of the bottom semiconductor region is one tenth or less of the impurity concentration of the bottom semiconductor region at the boundary surface between the bottom semiconductor region and the insulator film, is a location within 0.5 μm from the boundary surface between the bottom semiconductor region and the insulator film.

2. A lateral semiconductor device according to claim 1, wherein
    the amount of positive space charge and the amount of negative space charge within a zone of the semiconductor layer, the zone extending vertically at a region where the surface semiconductor region, the intermediate semiconductor region and the bottom semiconductor region are stacked, are identical when the semiconductor device is in an non conducting state.

3. A lateral semiconductor device according to claim 1, wherein
    the impurity concentration of the intermediate semiconductor region decreases from a boundary surface between the intermediate semiconductor region and the bottom semiconductor region towards a boundary surface between the intermediate semiconductor region and the surface semiconductor region.

4. A lateral semiconductor device according to claim 1, wherein
    the first semiconductor region extends from the surface of the semiconductor layer to the insulator film and makes contact with the bottom semiconductor region.

5. A lateral semiconductor device according to claim 1, wherein
    the impurity concentration of the bottom semiconductor region decreases along a direction extending from the first semiconductor region toward the second semiconductor region.

6. A lateral semiconductor device according to claim 1, further comprising:
    a source semiconductor region formed in a portion of the second semiconductor region, being isolated from the intermediate semiconductor region by the second semiconductor region, including an impurity of the first conductive type, and being electrically connected to the second main electrode,
    wherein the first conductive type is n-type,
    the second conductive type is p-type,
    the first main electrode is a drain electrode, and
    the second main electrode is a source electrode.

7. A lateral semiconductor device according to claim 1, further comprising:
    a source semiconductor region formed in a portion of the first semiconductor region, being isolated from the intermediate semiconductor region by the first semiconductor region, including an impurity of the second conductive type, and being electrically connected to the first main electrode,
    wherein the first conductive type is n-type,
    the second conductive type is p-type,
    the first main electrode is a source electrode, and
    the second main electrode is a drain electrode.

* * * * *